United States Patent
Van Schuylenbergh et al.

(10) Patent No.: US 7,517,769 B2
(45) Date of Patent: Apr. 14, 2009

(54) INTEGRATEABLE CAPACITORS AND MICROCOILS AND METHODS OF MAKING THEREOF

(75) Inventors: Koenraad Van Schuylenbergh, Sunnyvale, CA (US); Eugene M. Chow, Fremont, CA (US); JengPing Lu, San Jose, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 349 days.

(21) Appl. No.: 11/319,075

(22) Filed: Dec. 28, 2005

(65) Prior Publication Data

US 2007/0148895 A1 Jun. 28, 2007

(51) Int. Cl.
*H01L 21/20* (2006.01)
(52) U.S. Cl. .................... 438/381; 257/532
(58) Field of Classification Search ............ 336/200, 336/192; 257/531, 532; 361/306.3; 438/329, 438/957, 52, 381
See application file for complete search history.

(56) References Cited

U.S. PATENT DOCUMENTS

| | | | | |
|---|---|---|---|---|
| 5,130,276 A | * | 7/1992 | Adams et al. ............ | 438/52 |
| 6,053,397 A | * | 4/2000 | Kaminski ............... | 228/254 |
| 6,215,644 B1 | | 4/2001 | Dhuler | |
| 6,300,665 B1 | | 10/2001 | Peeters et al. | |
| 6,392,524 B1 | | 5/2002 | Biegelsen et al. | |
| 6,396,677 B1 | | 5/2002 | Chua et al. | |
| 6,534,249 B2 | | 3/2003 | Fork et al. | |
| 6,595,787 B2 | | 7/2003 | Fork et al. | |
| 6,606,235 B2 | | 8/2003 | Chua et al. | |
| 6,621,141 B1 | | 9/2003 | Van Schulenbergh et al. | |
| 6,646,533 B2 | | 11/2003 | Biegelson et al. | |
| 6,655,964 B2 | | 12/2003 | Fork et al. | |
| 6,661,637 B2 | * | 12/2003 | McIntosh et al. ......... | 361/233 |
| 6,743,982 B2 | | 6/2004 | Biegelsen et al. | |
| 6,891,240 B2 | | 5/2005 | Dunec et al. | |
| 6,922,327 B2 | | 7/2005 | Chua et al. | |
| 7,215,066 B2 | * | 5/2007 | Kawakubo et al. ........ | 310/348 |
| 2002/0080554 A1 | * | 6/2002 | Chua et al. .............. | 361/302 |
| 2002/0135440 A1 | * | 9/2002 | Ryhanen et al. .......... | 333/185 |
| 2002/0187662 A1 | | 12/2002 | Biegelsen et al. | |

(Continued)

OTHER PUBLICATIONS

U.S. Appl. No. 11/319,056, filed Dec. 28, 2005, Chow et al.

(Continued)

*Primary Examiner*—Thao X Le
*Assistant Examiner*—Ajay K Arora
(74) *Attorney, Agent, or Firm*—Oliff & Berridge, PLC

(57) ABSTRACT

Methods for integrally forming high Q tunable capacitors and high Q inductors on a substrate are described. A method for integrally forming a capacitor and a microcoil on a substrate may involve depositing and patterning a dielectric layer on the substrate, depositing and patterning a sacrificial layer on the substrate, depositing and patterning conductive material on the semiconductor substrate, depositing and patterning a polymer layer on the semiconductor substrate, removing an exposed portion of the conductive material exposed by the patterned polymer layer to release a portion of the conductive pattern from the semiconductor substrate to form out-of-plane windings of the microcoil, depositing second conductive material on exposed portions of the conductive material, and removing the sacrificial layer. The patterned conductive material may include a windings portion of the microcoil, an overlapping electrode portion of the capacitor and a support portion for the electrode of the capacitor.

20 Claims, 27 Drawing Sheets

U.S. PATENT DOCUMENTS

2003/0027081 A1 2/2003 Chua et al.
2003/0030965 A1 2/2003 Chua et al.
2003/0179064 A1 9/2003 Chua et al.
2006/0098059 A1* 5/2006 Ohguro et al. ................ 347/72

OTHER PUBLICATIONS

Popovich et al., "Impedance Characteristics of Decoupling Capacitors in Multi-Power Distribution Systems," IEEE, pp. 160-163, 2004.

Yao, "RF MEMS from a Device Perspective," J. Micromech. Microeng., vol. 10, pp. R9-R38, 2000.

Burghartz et al., "Integrated RF Components in a SiGe Bipolar Technology," IEEE Journal of Solid-State Circuits, vol. 32, No. 9, pp. 1440-1445, Sep. 1997.

Fan et al., "Universal MEMS Platforms for Passive RF Components: Suspended Inductors and Variable Capacitors," 5 pages.

Young et al., "A Micromachine-Based RF Low-Noise Voltage-Controlled Oscillator," IEEE Custom Integrated Circuits Conference, pp. 431-434, 1997.

MEMSCAP, Wireless Solutions, "High-Q Inductors," http://www.memscap.com/products-w-highq.htm.

MEMSCAP, Wireless Solutions, "Variable Capacitors," http://www.memscap.com/products-w-varicaps.htm.

Dec et al., "Microwave MEMS-Based Voltage-Controlled Oscillators," IEEE Transactions on Microwave Theory and Techniques, vol. 48, No. 11, pp. 1943-1949, Nov. 2000.

Yao et al., "A Low Power/Low Voltage Electrostatic Actuator for RF MEMS Applications," Solid-State Sensor and Actuator Workshop, pp. 246-249, Jun. 4-8, 2000.

Yoon et al., "A High-$Q$ Tunable Micromechanical Capacitor with Movable Dielectric for RF Applications," IEEE, 4 pgs, 2000.

Park et al., "Tunable Millimeter-Wave Filters using a Coplanar Waveguide and Micromachined Variable Capacitors," J. Micromech. Microeng., vol. 11, pp. 706-712, 2001.

Zou et al., "Development of a Waveguide Tuning Range MEMS Tunable Capacitor for Wireless Communication Systems," IEEE, pp. 17.2.1-17.2.4, 2000.

van der Tang et al., "A Monolithic 0.4 mW SOA LC Voltage-Controlled Oscillator," pp. 150-153.

Butler et al., "Adapting Multichip Module Foundries for MEMS Packaging," International Conference on Multichip Modules and High Density Packaging, pp. 106-111, 1998.

Scok et al., "A Novel MEMS LC Tank for RF Voltage Controlled Oscillator (VCO)," Transducers, 2001.

Brown et al., "A Varactor Tuned RF Filter," Short Paper to IEEE Trans, pp. 1-4, Oct. 29, 1999.

Chen et al., "Design and Modeling of a Micromachined High-$Q$ Tunable Capacaitor with Large Tuning Range and a Vertical Planar Spiral Inductor," IEEE Transactions on Electron Devices, vol. 50, No. 3, pp. 730-739, Mar. 2003.

* cited by examiner

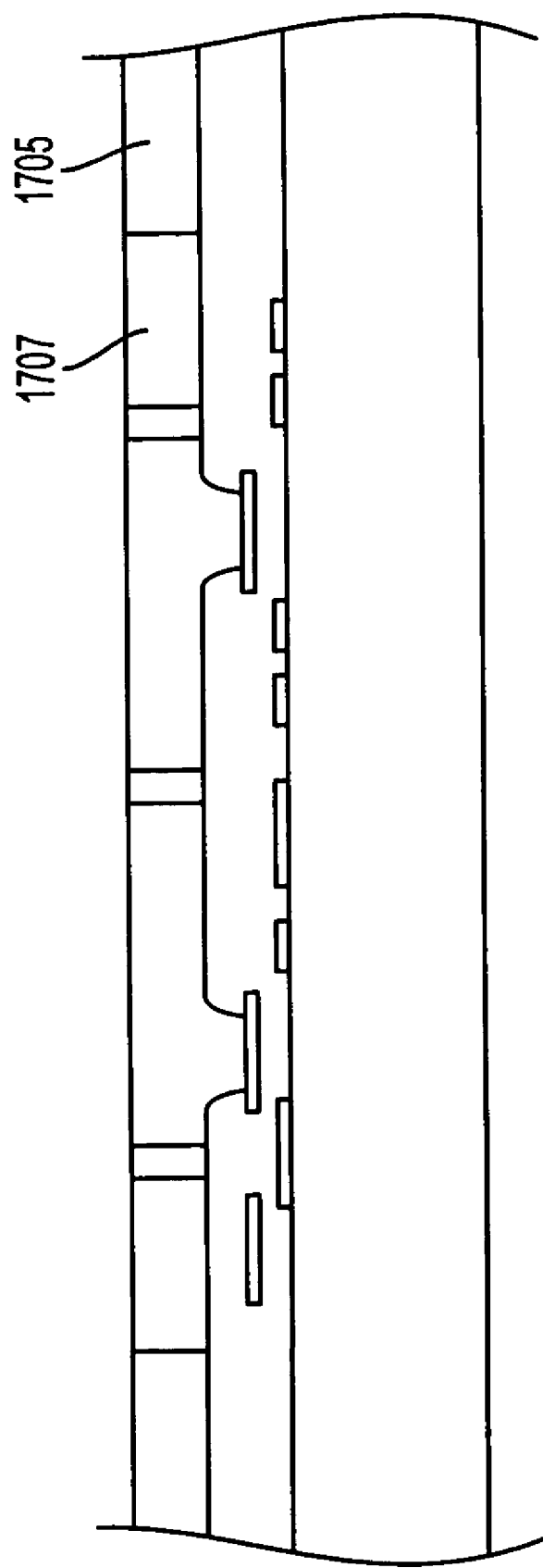

INTEGRATEABLE CAPACITORS AND MICROCOILS AND METHODS OF MAKING THEREOF

BACKGROUND

Integrateable capacitors and microcoils, and methods of making such integrateable capacitors and microcoils are described.

Efforts are being made to integrate inductors on semiconductor substrates, e.g., silicon and gallium arsenide integrated circuits. Known structures employ spirals parallel to the underlying substrate. When such structures are made on a substrate that is slightly conductive such as silicon, the coil magnetic fields induce eddy currents in the underlying substrate. Such eddy currents cause resistive dissipation and contribute to energy loss. When such coils are operated at high frequencies, the skin and proximity effects force the current to flow along outer surfaces of the conductive material. For example, at frequencies of 900 MHz, 1.9 GHz and 2.4 GHz, the "skin depth" is about 2 to 3 μm for typical conductive materials. Because only a portion of the cross section of the conductive material is utilized, AC resistance of the coil is significantly higher than the DC resistance of the coil.

Micro-fabricated capacitors and micro-fabricated inductors based on released 3D structures and MEMS processing, i.e., processes used to manufacture micro-electromechanical structures, offer improved electrical performance over components that are manufactured using planar IC processing. MEMS processing enables near ideal geometries with high Q, i.e., high quality factor. MEMS variable capacitors offer larger RF signal levels and less high-frequency distortion. Out-of-plane coil inductors manufactured using MEMS processing minimize eddy current loss. Process integration of high performance capacitors and inductors with integrated circuits is challenging.

SUMMARY

High performance (i.e., high Q) tunable capacitors and methods of making thereof are described herein.

Methods for manufacturing high Q tunable capacitors and high Q inductors on a single substrate are described herein.

Methods for integrating on chip inductors and tunable capacitors are described herein.

Manufacturing techniques for creating a tunable LC combination employing a coil structure and variable capacitor to provide high quality RF circuits on a silicon chip.

Embodiments described herein provide a method for integrally forming a capacitor and a microcoil on a substrate. The method may involve depositing and patterning a dielectric layer on the substrate, depositing and patterning a sacrificial layer on the substrate, depositing and patterning conductive material on the semiconductor substrate, depositing and patterning a polymer layer on the semiconductor substrate, removing an exposed portion of the conductive material exposed by the patterned polymer layer to release a portion of the conductive pattern from the semiconductor substrate to form out-of-plane windings of the microcoil, depositing second conductive material on exposed portions of the conductive material, and removing the sacrificial layer. The patterned conductive material may include a windings portion of the microcoil, an overlapping electrode portion of the capacitor and a support portion for the electrode of the capacitor.

Embodiments described herein separately provide a method for integrally forming a capacitor and a microcoil on a substrate. The method may involve forming and patterning a first dielectric layer on the substrate, depositing and patterning first conductive material on the substrate, depositing and patterning a second dielectric material on the substrate, depositing second conductive material on the substrate forming at least a first portion and a second portion, and planarizing an exposed surface of the second conductive material and the patterned second dielectric material. The method may further involve depositing and patterning a sacrificial layer on the planarized surface, removing the patterned second dielectric material, forming third conductive material on the sacrificial layer, depositing and patterning a polymer layer on the substrate, removing a portion of the first conductive material exposed by the patterned polymer layer to release a portion of the first conductive material from the substrate to form out-of-plane windings of the microcoil, depositing fourth conductive material on exposed portions of the first conductive material and the third conductive material, and removing the sacrificial layer. The first conductive material, the second conductive material and the fourth conductive material may each include a first portion and a second portion corresponding to a first winding portion and a second winding portion of the same microcoil. The third conductive material may form a capacitance region between the first winding portion and the second winding portion.

Embodiments described herein separately provide a method for integrally forming a capacitance region and a microcoil on a substrate. The method may involve forming a first electrode and a fixed portion of a second electrode associated with the capacitance region on the substrate, depositing and patterning a sacrificial layer on the first electrode, depositing and patterning a conductive material on the substrate, the patterning forming a pattern corresponding to windings of the microcoil and a pattern corresponding to a moveable portion of the second electrode, the moveable portion of the second electrode connecting to the fixed portion of the second electrode, depositing and patterning a mask layer on the substrate, removing a portion of the deposited and patterned conductive material exposed by the mask layer to release at least a portion of the windings pattern from the substrate to form out-of-plane windings of the microcoil, depositing a second conductive material on the formed out-of-plane windings of the microcoil and the moveable portion of the second electrode, and removing the sacrificial layer forming a gap between the first electrode and the second electrode of the capacitor.

These and other optional features and possible advantages of various exemplary embodiments are described in, or are apparent from, the following detailed description of exemplary embodiments of variable capacitors in potential combination with an out-of-plane inductor, and their integration on circuit substrates.

BRIEF DESCRIPTION OF THE DRAWINGS

Exemplary embodiments described herein will be described in detail, with reference to the following figures, in which:

FIG. 2(a) illustrates a top view, FIG. 2(b) illustrates a cross-sectional view along line b-b' of FIG. 2(a), and FIG. 2(c) illustrates a cross-sectional view along line c-c' in FIG. 2(a);

FIGS. 17(a)-17(e) illustrate a process of forming the exemplary concentric variable capacitor microcoil device shown in FIG. 16(a);

EXEMPLARY EMBODIMENTS

Throughout the following description, numerous specific structures/steps of some exemplary embodiments are set forth. It is not necessary to utilize all of these specific structures/steps in every embodiment. Various combinations of the structures/steps may be employed in different embodiments. In the following description, when a layer is referred to as "on", "above", "overlapping" or "under" another layer, the layer may be directly "on", "above", "overlapping" or "under" the other layer or one or more intervening layers may be present between the layer and the another layer. In the following description, when a layer is referred to as "between" two layers, the layer may be the only layer between the two layers or one or more intervening layers may also be present between the two layers. Throughout the following description, reference to "a material" may include a material formed of a plurality of different layers and/or a plurality of different materials.

In general, capacitors include a dielectric layer interposed between electrodes of the capacitor. One aspect of the exemplary embodiments described herein provides capacitors employing air gaps between electrodes of the capacitor to reduce and minimize loss. By reducing and/or minimizing loss, higher Q capacitors, e.g., variable capacitors, can be obtained. It is generally difficult to controllably unroll a bent electrode. In embodiments employing an air gap instead of a physical layer, such uncontrolled unrolling or straightening may create an electrical short, i.e., undesirable electrical connection between different terminals because in contrast to a dielectric layer arranged between the electrodes, air is not able to prevent undesirable physical contact of the two electrodes.

Figure 1A:
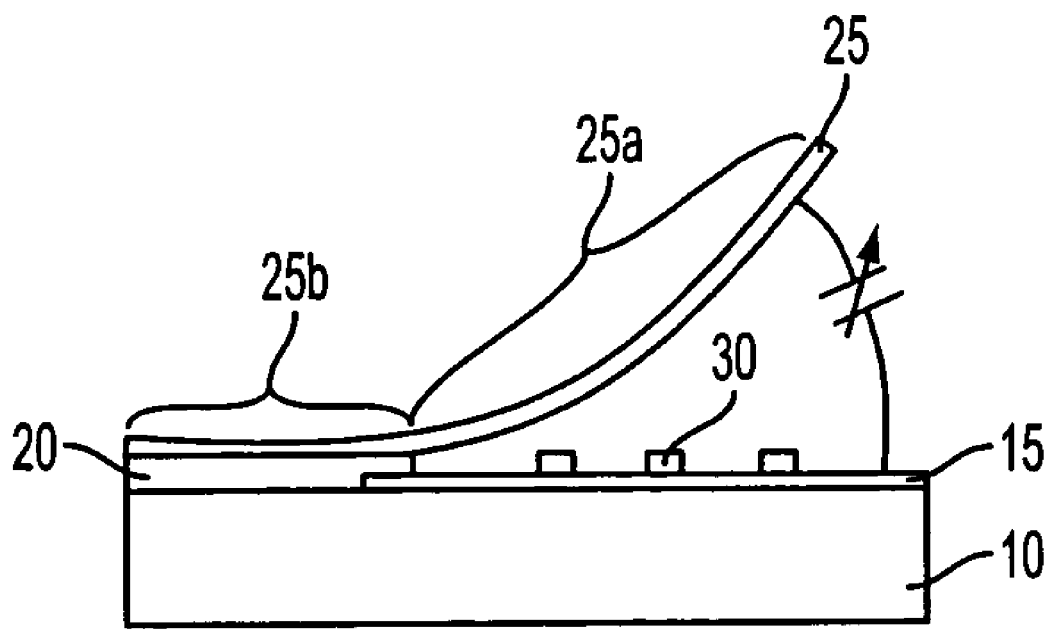
FIGS. 1(a)-1(b) are cross-sectional views of an embodiment of a bent-beam variable capacitor including an air gap and a stop.
Figure 1B:
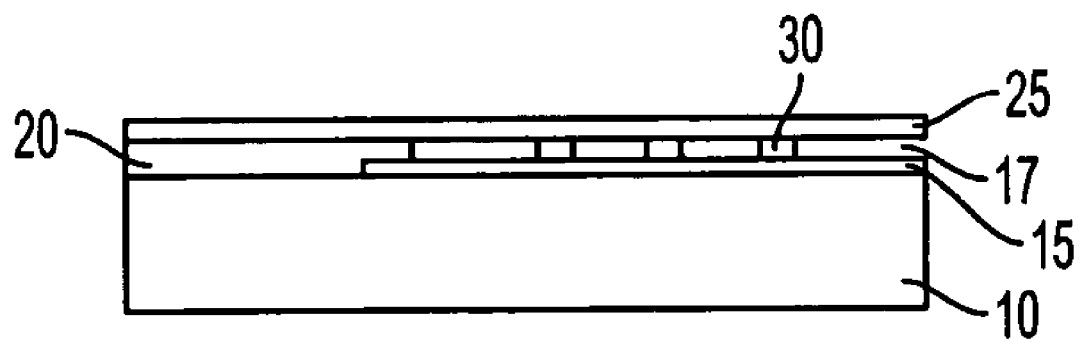

FIGS. 1(a) and 1(b) illustrate a high Q bent beam variable capacitor employing an air gap. As illustrated in FIGS. 1(a) and 1(b) the bent beam variable capacitor may include a substrate 10, a first electrode 15, e.g., bottom electrode, arranged on the substrate 10, a low loss dielectric layer 20 arranged on another portion of the substrate and a second electrode 25, e.g., top electrode. The low loss dielectric layer 20 may overlap a portion of the first electrode 15. The second electrode 25 may be arranged on and may extend out from the low loss dielectric layer 20 such that the second electrode 25 has a free portion 25a and an anchored portion 25b.

In exemplary embodiments, to reduce and/or eliminate an electrical short between the first and second electrodes 15 and 25, the variable capacitor may include one or more stops 30 arranged between the first and second electrodes 25. The free portion 25a of the second electrode 25 may be a portion of the second electrode 25 that extends beyond the low loss dielectric layer 20 and overlaps, e.g., extends over, the first electrode 15 forming a space 17, e.g., air gap, between the free portion 25a of the second electrode 25 and the first electrode 15. The anchored portion 25b of the second electrode 25 may be a portion of the second electrode 25 that is directly attached to the substrate 10 or indirectly attached to the substrate via one or more intermediate layers, e.g., low loss dielectric 20, of the variable capacitor.

In embodiments, the second electrode 25 may be formed of a stress engineered conductive material that biases the free portion 25a of the second electrode 25 into a bent or curved state. A position of the free portion 25a of the second electrode 25 may be controllably changed b applying an electrical voltage to the first electrode 15 and/or second electrode 25. As discussed above, in embodiments, the stop 30 may be arranged in the space 17 between the first electrode 15 and the free portion 25a of the second electrode 25 to reduce the occurrence of and/or prevent the first electrode 15 contacting the free portion 25a of the second electrode 25.

The stop 30 may be arranged on a surface of the first electrode 15 that faces the second electrode 25 or on a surface of the free portion 25a of the second electrode 25 that faces the first electrode 15. In embodiments including a plurality of stops 30, some stops 30 may be arranged on the surface of the first electrode 15 and some stops 30 may be arranged on the surface of the second electrode 25. FIGS. 1(a) and 1(b) illustrate an exemplary embodiment including stops 30 arranged on the surface of the first electrode 15 that faces the second electrode 25. As discussed in more detail below, each of the first and second electrodes may be formed of a single layer or material and/or a plurality of layers or materials.

In embodiments, the second electrode 25 may be made of a stress engineered conductive material. In general, a stress engineered conductive material is a material that has a designed stress gradient in a direction that is normal to a stressed plane corresponding to a substrate plane in which the stress engineered conductive material was formed. In general, after the conductive material is formed in the stressed plane, the conductive material is released and allowed to move away from the stressed plane. The conductive material may be released by removing an underlying sacrificial or adhesion layer and allowing at least a portion of the stress engineered conductive material to move away from the stressed plane.

In embodiments, the stops 30 may be arranged differently. Stops 30 may be arranged with equal spaces between adjacent ones of the stops 30. A space between adjacent stops 30 may gradually increase or decrease. For example, larger gaps may exist between adjacent ones of the stops 30 on a first end portion of the electrode 15 that is closer to the low loss dielectric layer 20 and smaller gaps may exist between adjacent ones of the stops 30 on a second end portion of the electrode 15 that is further from the low loss dielectric layer 20.

In embodiments, the space 17 between the first electrode 15 and the second electrode 25 may extend less than about 1 µm along a direction perpendicular to the substrate 10, e.g., the space 17 may have a height less than about 1 µm. In general, the smaller the height of the space 17, the smaller the planar area of the variable capacitor and the smaller the area the variable capacitor will occupy on a device. Embodiments implementing one or more of the features described herein provide variable capacitors including electrodes with an air gap having a height of less than about 1 µm between the electrodes and including at least one stop for reducing and/or preventing an electrical short between the electrodes.

In embodiments, the stop(s) 30 may be made of BCB (benzocyclobutene based polymer). In embodiments, the stop(s) 30 may be made of a dielectric material. In embodiments, the stops 30 may be made of a low loss dielectric material.

A bent-beam variable capacitor employing an air gap and at least one stop 30, such as, the exemplary variable capacitor illustrated in FIGS. 1(a) and 1(b) may be tuned (i.e., capacitance thereof can be set) by adjusting the distance between the first electrode 15 and the second electrode 25. Accordingly, FIG. 1(a) illustrates a low capacitance state of the exemplary variable capacitor and FIG. 1(b) illustrates a higher capacitance state of the exemplary variable capacitor.

U.S. Pat. No. 6,606,235 to Chua et al. and U.S. Pat. No. 6,595,787 to Fork et al. (Fork) disclose exemplary methods for forming out-of plane micro-device structures and the subject matter disclosed therein is hereby incorporated by reference in its entirety. Other known methods for fabricating or manufacturing out of plane or variable capacitors may be employed and modified to include stops.

For example, a high Q variable capacitor employing an air gap and at least one gap stop, such as, the exemplary bent-beam variable capacitor illustrated in FIGS. 1(a) and 1(b) may be formed by: (1) forming a first electrode by depositing and patterning a first layer of a conductive material, e.g., metal, on a substrate; (2) forming a dielectric layer, e.g., BCB, on the conductive material; (3) patterning the dielectric layer to form a stop on the patterned conductive material; (4) depositing a sacrificial layer on the patterned conductive material and the patterned dielectric material; (5) forming a second electrode by depositing and patterning an elastic, stress-engineered and conductive material over the sacrificial layer; and (6) removing the sacrificial layer. The step of forming the second electrode may also include, for example, depositing a seed layer, depositing patterning a plating mask, and electroplating the exposed portion of the patterned conductive material.

The substrate may be any material that can survive the processing conditions, which generally includes a wide variety of materials due to the inherently low process temperatures involved in the fabrication of stress-engineered materials. Exemplary substrate materials include glass, quartz, ceramic, silicon and gallium arsenide. Substrates with existing passive or active devices may also be employed. The sacrificial layer may be a material, e.g., Si, Ti, SiN, that can be quickly removed by selective dry or wet undercut etching. Exemplary etchants for a Si release layer include KOH (wet processing) and $XeF_2$ (dry processing). Hydrofluoric acid may be used to etch Ti or SiN release layers. A conductive material deposited to form the second electrode may be an elastic material with an inherent stress profile built in and thus, when at least a portion of the sacrificial layer is removed, the inherent stress profile in the conductive material of the second electrode biases the free portion (i.e., portion above air gap and the stop) of the second electrode away from the first electrode and into a different position, e.g., bent or curved shape. A stress profile may be built into a material by varying growth conditions of the layer or material and thereby creating a stress-engineered material. For example, in the case of sputtering, the pressure at which material is deposited may be controlled to create a stress profile. In some embodiments, the second electrode may be formed of a single elastic material. In embodiments, the second electrode may be made of NiZr, MoCr, Ni, or another suitable material and/or a plurality of materials and/or layers.

For example, the second electrode may include a conductive material and an elastic material layer. Gold may be used as the conductive material and MoCr may be used for the elastic layer. Depending on the design, any material capable of holding large stresses may be used to form all or part of the bent or curved electrode (i.e., second electrode) and such material(s) may be clad with additional layer(s) that are good seed layers for plating, for example. In embodiments, stresses may be placed into a material that is suitable for plating or soldering. For example, stresses may be placed into a layer of Ni or its solution hardened alloys.

One reason curved or bent beam electrodes are advantageous is because such curved or bent beams can be adjusted to a wide range of positions relative to another electrode of the variable capacitor and thus, the range of possible capacitances at which the variable capacitor may be employed is large. Due to the difficulty in controllably adjusting or unrolling a bent electrode of a bent beam variable capacitor it may be very difficult to utilize a full range of possible capacitances of the variable capacitor. The full range of capacitors may not be employed if the bent or curved beam snaps down as the bent or curved beam approaches the substrate. Such a snap down effect may make it difficult to make fine adjustments, especially when the bent or curved beam is almost flat. A more detailed of this electrostatic snap down effect is provided in U.S. Pat. No. 6,891,240 to Dunec et al. Thus, generally such bent beam capacitors may be inherently limited to about a 50% tuning ratio.

Figure 2A:
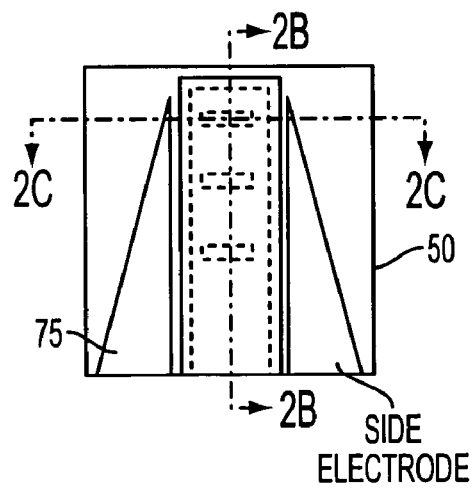
FIGS. 2(a)-2(c) illustrate another exemplary embodiment of a bent-beam variable capacitor including an air gap, a gap stop and side electrodes for actuation, where
Figure 2B:
Figure 2C:
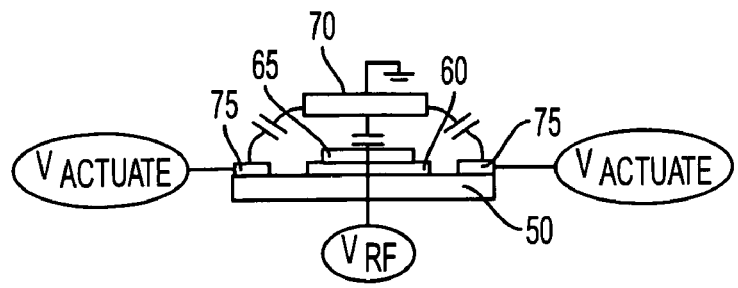

FIGS. 2(a)-2(c) illustrate another embodiment of a bent-beam variable capacitor. The exemplary bent-beam variable capacitor illustrated in FIGS. 2(a)-2(c) employs side electrodes to help reduce and/or prevent the bent or curved electrode from snapping down as it approaches the fixed electrode. Such embodiments also enable finer adjustment of the bent or curved beam over a greater amount and/or over the entire tuning range of the variable capacitor. FIGS. 2(a)-2(c) illustrate a three electrode variable capacitor, including a curved or bent electrode 70, side electrodes 75, and a second electrode 60 overlapping with at least a portion of the curved or bent electrode 70.

In particular, FIG. 2(a) illustrates a top view, FIG. 2(b) illustrates a cross-sectional view along line b-b' of FIG. 2(a), and FIG. 2(c) illustrates a cross-sectional view along line c-c' in FIG. 2(a). As illustrated in FIG. 2(c), the curved or bent electrode, e.g., cantilever, 70 may be grounded, while the side electrodes 75 may be used to actuate the curved or bent free electrode 70. The second electrode 60 may carry an RF signal. Gap stops, as discussed above, may be employed in conjunction with side electrodes described in relation to FIGS. 2(a)-2(c).

Figure 3:
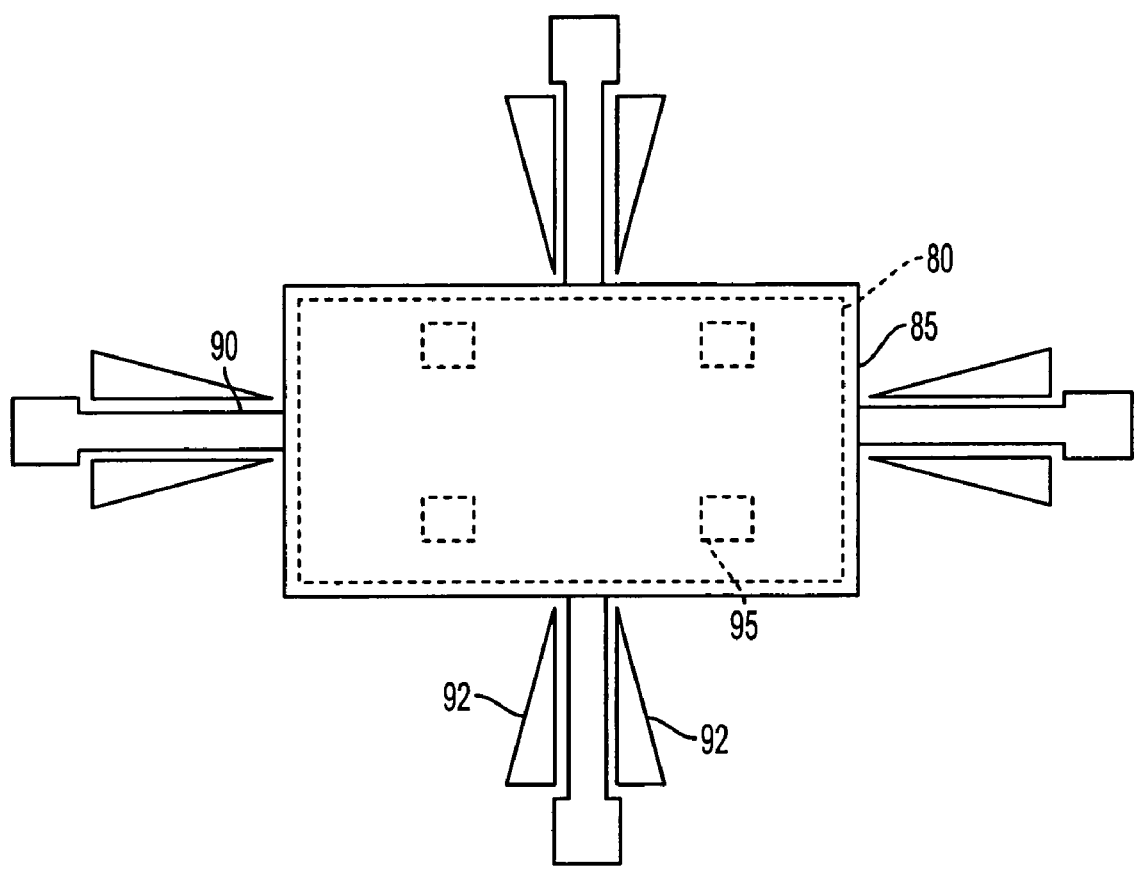
FIG. 3 is a top view of another exemplary embodiment of a variable capacitor with side electrodes.

FIG. 3 illustrates another exemplary embodiment of a variable capacitor. More particularly, FIG. 3 illustrates a parallel plate variable capacitor. As shown in FIG. 3 a variable capacitor may include a first plate 80 provided on a substrate (not shown) and a second plate 85 that at least partially overlaps the first plate. A plurality of curved/bent beams or legs 90 may support the second plate 85 such that a space exists between the first plate and the second plate. Side electrodes 92 may be provided along sides of each or some of the curved/bent beams or legs 90.

The space between the first and second plates 80, 85 may be adjusted based on the amount of extension or bending of the plurality of legs 90. In some embodiments, the side electrodes 92 may be provided to supply an actuation voltage to the legs 90. One or more of the side electrodes 92 may be provided adjacent to some or all of the legs 90. More particularly, the side electrodes 92 may be used to supply a direct current DC actuation voltage for adjusting the bending or curving of the legs 90. For example, the first plate 80 fixed to the substrate may carry the RF signal while the legs 90 and the second plate 85 may be grounded, and the side electrodes 92 may actuate the legs 90. In some embodiments, the stops 30 discussed above may be included between the first plate 80 and the second plate 85.

In embodiments, the first plate 80 may be provided such that it only overlaps with the second plate 85 and not the legs 90 supporting the second plate to help reduce the fixed capacitance and to minimize electrical shorts between the first and second plates 80, 85. For example, the first plate 80 may be substantially equal, equal to, or less than a size of the second plate 85.

Aside from low-loss electrode gaps, e.g., air gaps instead of dielectrics and larger tuning ranges, e.g., controllable adjustment of the curved or bent beam using side electrodes, capacitors that operate with a low actuation voltage are desired. Capacitors that are controllable such that adjustments in the position of the curved or bent beam may be made for amounts of about 1 μm or less are desired.

Figure 4:
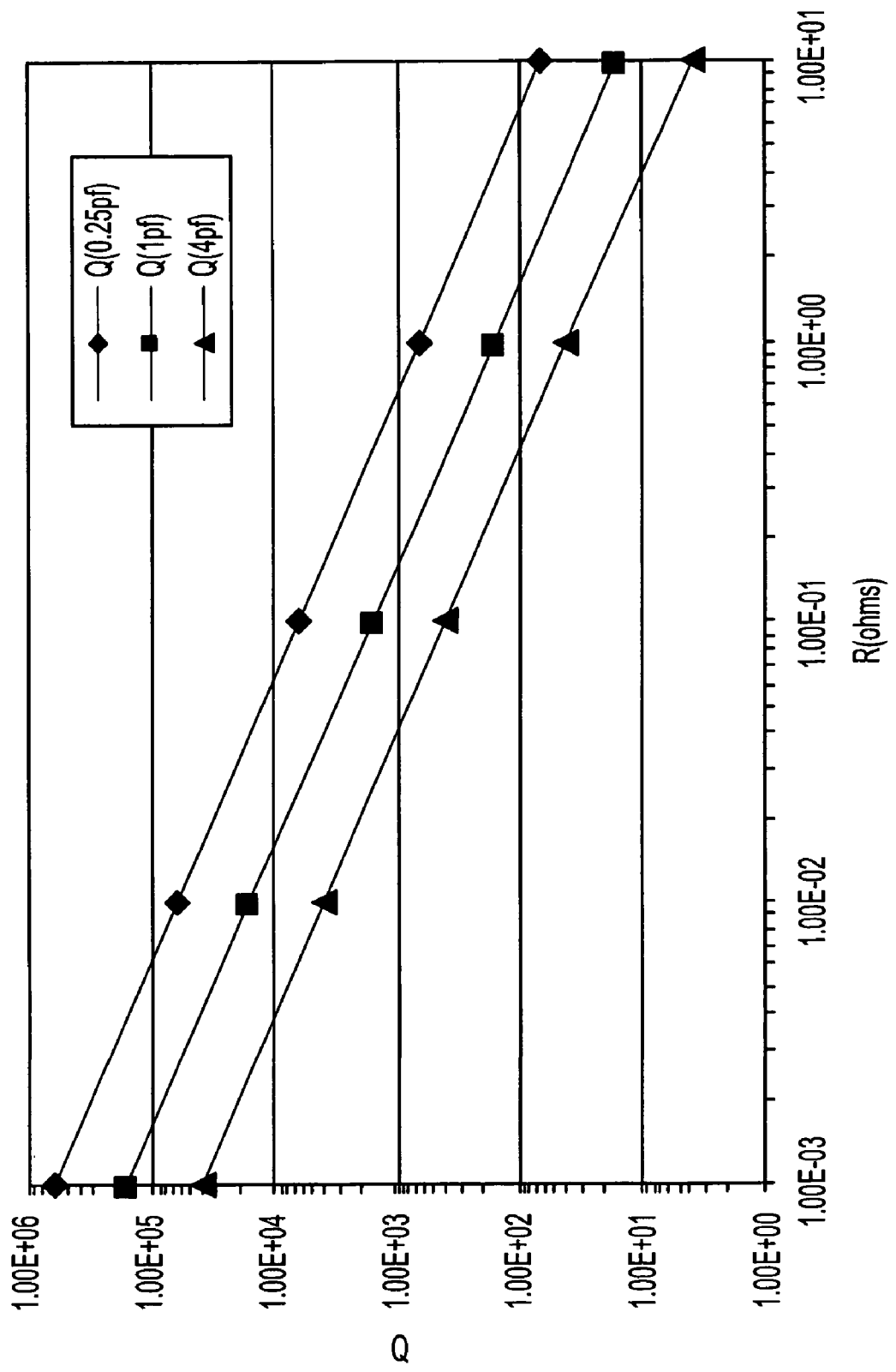
FIG. 4 is a graph illustrating a relationship between the Q of a capacitor at 1 GHz as a function of capacitance and series resistance.

With regard to the high Q, i.e., high quality, characteristic, Q is inversely related to resistance. FIG. 4 illustrates an exemplary relationship between quality factor Q of a capacitor at 1 Ghz as a function of capacitance and series resistance R expressed in Ohms. This series resistance models losses that may occur in the capacitor dielectrics and conductors. The top (diamond), middle (square) and bottom (circle) lines illustrate the Quality Factor to Resistance relationship for a 0.25 pf, a 1 pf, and a 4 pf capacitor, respectively. In general, as illustrated in FIG. 4, irrespective of the capacitance, as the resistance increases, the quality factor declines. Thus, in general, to provide high Q capacitors, the resistance of the capacitor may be maintained as low as possible.

Low electrical resistance is not the only characteristic generally relevant for providing high Q bent/curved beam variable capacitors. As discussed, above, the material used for the bent/curved beam or electrode may need to be capable of holding large stresses to provide variable capacitance settings. Molybdenum chromium alloy (MoCr) is an example of a material that is capable of withstanding large stresses. However, MoCr has relatively low electrical conductivity, i.e., high resistance. In embodiments, one way of providing a low resistance bent/curved electrode is by utilizing a highly conductive material, i.e., low resistance material, in combination with a material that is capable of withstanding large stresses. For example, copper having relatively low resistance may be utilized in conjunction with MoCr, which generally has high yield stress characteristics, but poor electrical conductivity.

By increasing the materials or layers of the bent or curved beam/electrode the overall thickness of the electrode may also increase and the higher thickness t may correspond to increased stiffness. For example, stiffness may increase as $t^3$ and the snap down voltage increases as $t^{1.5}$ for parallel plate approximation.

The structure and materials used for the variable capacitor may generally be determined based on the characteristics of the application, e.g., RF, low frequency, high voltage, etc., for which the variable capacitor is to be used. For example, experiments with variable capacitors having a bent beam formed of MoCr alone, i.e., no copper plating, suggest that about 40 V or more are required to actuate the bent beam. Thus, such a bent electrode may not be useful in RF electronics, which generally operate at about 5 V or less. The bent beam may also create a relatively high parasitic inductance, which limits the electrical self-resonance. While such variable capacitors may not be as practical for RF circuit applications, such bent beam variable capacitors may be more practical for low frequency and high voltage applications. Thus, in general, it may be advantageous to select capacitors considering the structure and/or materials used for forming the capacitor and the environment in which the capacitor is to be employed.

For example, microfabricated parallel-plate capacitors may be better suited for RF applications because microfabricated parallel-plate capacitors may have relatively lower actuation voltages and/or may be easier to integrate processing of the capacitor with the processing of out-of-plane inductors or microcoils. Generally, in RF circuit applications variable capacitors with relatively high Qs, high self resonance frequencies, and low actuation voltages, e.g., about 5 V or less, may be employed. As discussed above because Q is generally inversely related to resistance, one approach to providing a relatively high Q variable capacitor, is to provide a low resistance structure.

In embodiments, microfabricated parallel-plate capacitors may employ a low resistance material, e.g., copper, in addition to the elastic or stressed material to achieve a higher Q by increasing conductivity and reducing resistance. For example, a low stress copper process can enable thick plating, e.g., about 5 μm or greater, for lowering resistance without excessive warping in the membrane. Warping has been a problem with known metal-based parallel plate variable capacitors. In embodiments, the plating areas, i.e., areas to be electroplated, can be defined using plating masks, e.g. Ti plating mask so that a suspension portion of a moveable electrode of the parallel plate capacitor is not plated. In particular, the suspension portion of the moveable electrode may be masked during the electroplating process to maintain the flexibility of the suspension portion and to reduce and/or prevent an increase in stiffness and/or actuation voltage.

As devices are getting smaller and smaller, methods and materials for implementing small controlled air gaps, e.g., about 1 μm or less, in microfabricated parallel-plate capacitors are desired. Known parallel-plate capacitor processes employ silicon dioxide followed by wet etching and critical point drying, or polymers, e.g., photoresist, followed by oxygen plasma for forming gaps between the electrodes.

In some embodiments, a uniform release or sacrificial layer and an etching material that can isotropically etch the release or sacrificial layer without harming other structures or devices on the substrate may be used to form the gap. For example, a silicon sacrificial layer and an etchant, e.g., xenon diflouride, may be used to form gaps including gaps of about 1 μm or less between the parallel plates of the capacitor.

Release processes that causes very little or no harm to the other structures of devices are also advantageous because the release process can be performed on wire-bonded and packaged devices. Handling released devices during manufacturing is generally very costly. Thus, release processes, such as the exemplary process described above, which may be performed on wire-bonded and packaged devices are advantageous because the device(s) can be diced and packaged before the release process is performed. Such release processes may also help reduce manufacturing costs.

Figure 5A:
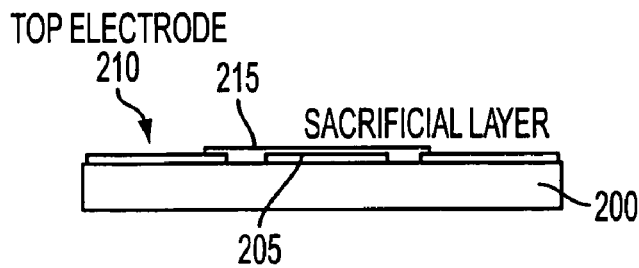
FIGS. 5(a)-5(d) illustrate an exemplary embodiment of a manufacturing process for a parallel-plate capacitor.
Figure 5B:
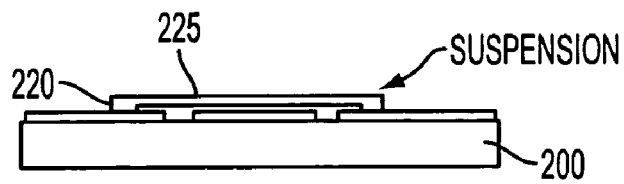
Figure 5C:
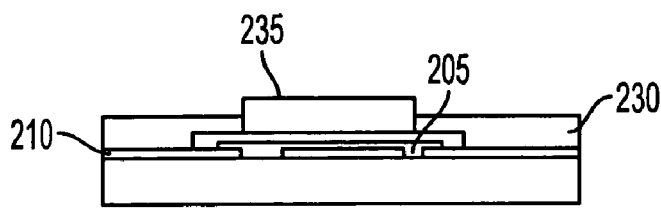
Figure 5D:
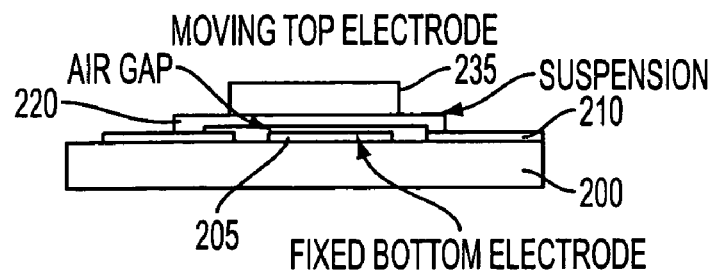

FIGS. 5(a)-5(d) generally illustrate an exemplary process that may be employed for forming parallel-plate capacitors. As illustrated in FIG. 5(a) a conductive material may be deposited, e.g., thin film sputtered, and patterned to form a bottom electrode 205 and portions of the top electrode 210 on a substrate 200. The substrate 200 may be a prefabricated IC. A sacrificial layer 215 may then be deposited and patterned. Next, as shown in FIG. 5(b), a material for a suspension portion of the top electrode 210 may be deposited forming a suspension portion 220. A plating seed layer 225 may be deposited and pattered on the suspension portion 220. As illustrated in FIG. 5(c), a mask 230 may be deposited and patterned before a plated membrane 235 is deposited and formed. As illustrated in FIG. 5(c), the plated member 235 may be formed on portions of the device where there is no mask 230. After the plated membrane 235 is formed, the mask 230 may be stripped and the sacrificial layer 215 may be etched to release the free the suspension portion 220, as illustrated in FIG. 5(d), leaving a gap between the moving top electrode 210 and the fixed bottom electrode 205. In some embodiments, the mask 230 may be a resist mask. In embodiments, the mask 230 may be a layer including titanium, which has been demonstrated by the Applicants of this application to be an effective Cu plating mask.

The plating seed layer 225 may be a gold seed layer. The sacrificial layer 215 may be silicon and xenon difluoride may be used as the etchant for etching the sacrificial layer 215, e.g., silicon sacrificial layer. In some embodiments, the plated membrane 235 may be a copper plated membrane. As discussed above, the pressure at which a material is deposited may be controlled to create a stress profile. In some embodiments, the copper plated membrane may be formed with a residual tensile stress of about 5 MPa to about 20 MPa. A residual tensile stress of about 5 MPa to about 20 MPa may be advantageous because slightly tensile membranes generally do not buckle and/or significantly raise actuation voltages. A low stress released metal process such as the process described above may be advantageous because the process may be used to form gap structures, including gap structures of about 1 μm or less. Suspension forming design may also be simplified when the residual stress is controlled, thereby enabling, for example, designs that permit rotational symmetry with a lateral compliance for absorbing residual stress and maintaining the designed gap.

Figure 6:
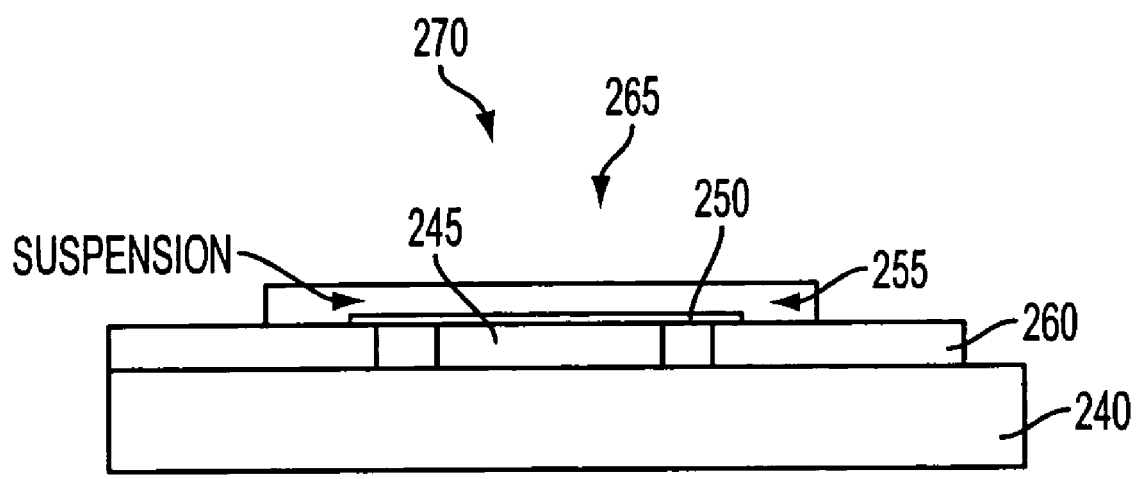
FIG. 6 is a cross-sectional diagram of an exemplary embodiment of a parallel plate capacitor with a thick bottom electrode.

In embodiments, as a variation to the thin film sputtered bottom electrode 205 of the parallel plate capacitor described above in relation to FIGS. 5(a)-5(d), the thin film sputtered bottom electrode 205 may be replaced with a thick electroplated metal electrode, e.g. thick electroplated copper electrode. Such a thick electroplated metal electrode may further reduce the variable capacitor resistance and increase the Q of the capacitor. FIG. 6 illustrates a cross-sectional diagram of an exemplary embodiment of a parallel plate capacitor with a thick bottom electrode. As shown in FIG. 6, the parallel plate capacitor may include a substrate 240, e.g., prefabricated IC, a thick bottom electrode 245, an anchor and suspension portion 255 for connecting the stationary portion(s) 260 of the top electrode 270 to the moving portion(s) 265 of the top electrode 270. By comparing FIG. 6 and FIG. 5(d), it can be seen that the structures are similar, except for a thickness of the bottom electrodes 205, 245 and the low loss material 250. Planarization may facilitate further processing, e.g., forming additional structures thereon. Planarization may provide a flatness that helps permit fine air gap control and ensures that contact to the underlying circuitry is not hindered. The low loss material 250 may be BCB (benzocyclobutene based polymer). The low loss material 250 may be used to fill the gaps between the bottom electrode 245 and the stationary portion(s) 260 of the top electrode 270. In such embodiments, after the low loss material 250 is deposited, an upper surface of the deposited low loss material 250, an upper surface of the stationary portions 260 and an upper surface of the thick bottom electrode 245 may be polished and planarized. The thick bottom electrode 245 of such embodiments may reduce the resistance between neighboring variable capacitors if, for example, multiple variable capacitor are used in parallel. In some embodiments, the thick metal layer may be used as a (slotted) ground plane for the inductor, as discussed in U.S. Pat. No. 6,624,141 to K. Van Schuylenbergh et al.

In embodiments employing the thick bottom electrode 245, the main source of resistance may be the electrical resistance of the anchor and suspension portion 255, i.e., a structure that connects the top electrode 270 to the rest of the circuit or substrate 240. There may be many design restrictions imposed on the anchor and suspension portion 255. For example, to minimize electrical resistance, thick and short legs may be desirable. Thick and short legs may also help in keeping the parasitic inductance low. On the other hand, to enable low actuation voltages, structures with low spring constants may be desired and low spring constants generally result from thin and long structures. In embodiments, longer legs may be employed to enable rotational compliance for gap control. In embodiments, mechanical resonance of the variable capacitor may be designed to minimize Brownian induced phase noise at the appropriate frequencies.

One way to address the conflicting design restrictions imposed on the anchor and suspension portion 255 by the electrical and mechanical requirements may be to remove, e.g., make electrically non-existent, the anchor and suspension portion 255 from the RF part of the electrical circuit.

Figure 7A:
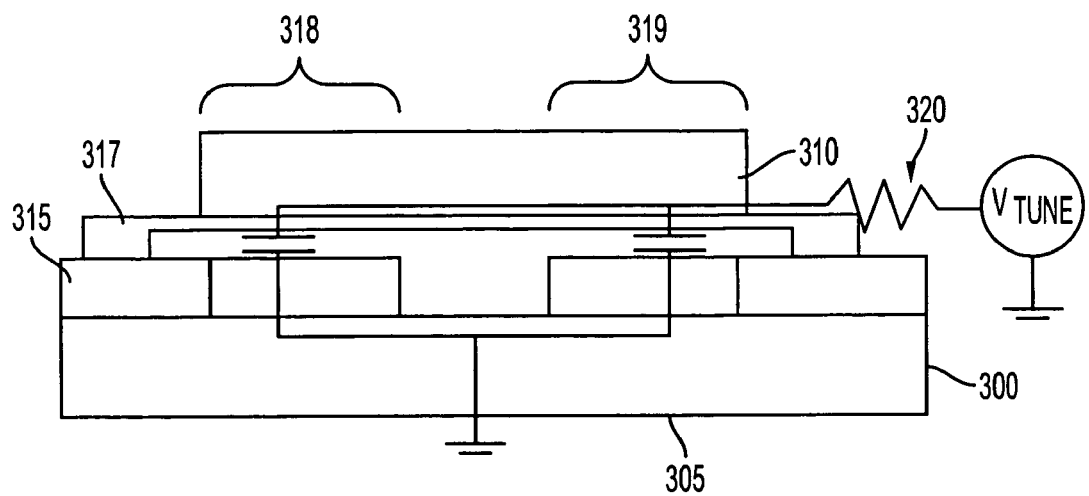
FIG. 7(a) illustrates a split-bottom electrode configuration structure of an exemplary embodiment of a parallel plate capacitor that allows for the suspension portion to be very independent of the RF part of the electrical circuit.

FIG. 7(*a*) illustrates a split-bottom electrode configuration structure of an exemplary embodiment of a parallel plate capacitor that enables a suspension portion 317 to be independent of the RF part of the electrical circuit. By splitting the bottom electrode 305 into a plurality of (e.g., two) equal portions, a series of two capacitors may be formed by each bottom electrode portion 305 and a corresponding overlapping portion of a top electrode 310.

As shown in FIG. 7(*b*), in a balanced oscillator circuit, for example, the top electrode 310 may remain at a constant voltage Vtune during circuit operation while the other bottom electrodes 305 carry opposite and equal RF voltages. As a result, no RF current may flow through the suspension portion 317 and thus, the resistance of the suspension portions does not affect the RF quality factor. This mitigates the electrical requirements of the suspension portion and the mechanical design requirements thereof.

As illustrated in FIG. 7(*a*), in this exemplary embodiment, the parallel plate capacitor includes a plurality (e.g., 2) of symmetric bottom electrode portions 305 formed on the substrate 300 (e.g., pre-fabricated IC) forming a plurality of series capacitors 318, 319 with the top plate electrode 310. The formed series of capacitors 318, 319 may together function as a variable capacitor and may balance the RF signals at the plurality of bottom electrodes 305 while the top electrode 310 may be held at substantially a constant voltage Vtune. In embodiments employing such thick bottom electrodes 305, a low loss dielectric 315 may be deposited to fill the gap between adjacent ones of the bottom electrodes 305 and a resulting surface of the low loss dielectric 315 and the bottom electrodes 305 may be polished and planarized.

Although the capacitance density of the variable capacitor illustrated in FIG. 7(*a*) may be halved as compared to the exemplary embodiment of the parallel plate capacitor illustrated in FIG. 6, the suspension portion 317 may be designed to be thin and long, which may allow improved mechanical performance without imposing a high resistance on the RF circuit. In the exemplary embodiment illustrated in FIG. 7(*a*), by employing symmetric bottom electrodes 305 and a symmetric arrangement relative to the top electrode 310, uniform pull down forces may be ensured. In the exemplary embodiment illustrated in FIG. 7(*a*), the variable capacitor may be tuned by adjusting an average voltage difference between the top electrode 310 and the bottom electrodes 305. In embodiments in which the RF signal frequency may be too high to mechanically move the capacitor plates, the average voltage difference between the top and bottom plates may be relevant. In such embodiments, the mechanical behavior of the variable capacitor itself decouples the actuation functionality from the RF functionality. It may also be possible to decouple the actuation functionality from the RF functionality by using physically separate parts, e.g., an RF capacitor, a separate actuator and a mechanical link tying them together.

Figure 8:
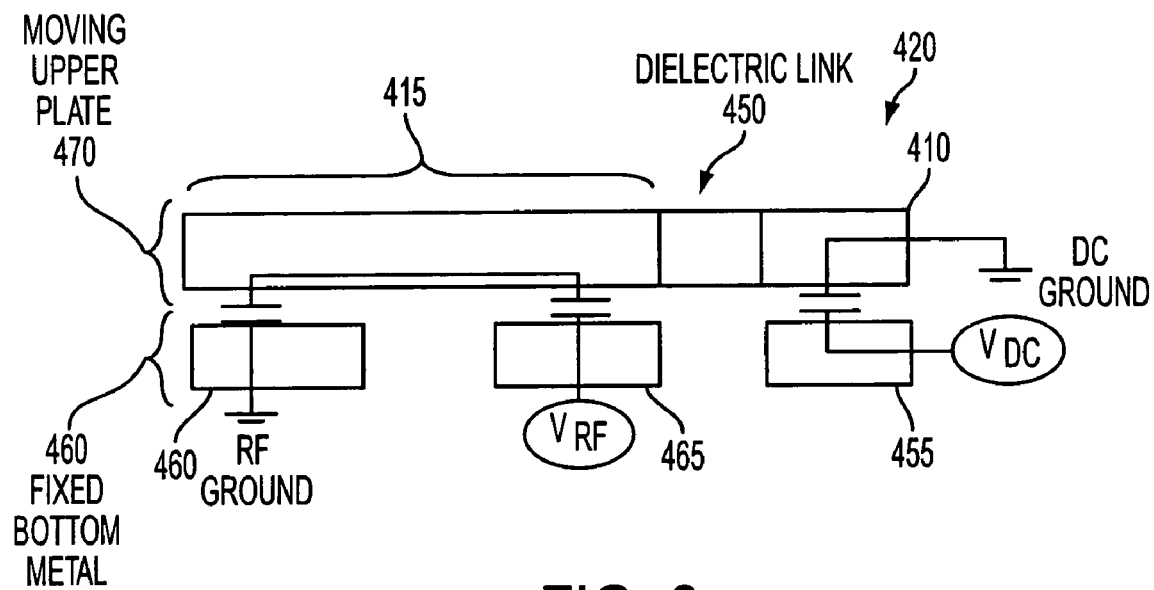
FIG. 8 is a schematic of an exemplary embodiment of a variable parallel plate capacitor employing a tethered actuator.

Variable capacitors employing one, more or any combination of the features described above may be implemented. A tethered actuator, as show in FIG. 8 may also be implemented in various embodiments. FIG. 8 illustrates a partial schematic of an exemplary variable parallel plate capacitor employing a tethered actuator. To aid in the understanding features of the tether 450, a suspension member for supporting the top electrode is omitted from FIG. 8. The tether 450 may actuate a top electrode 470 of a variable parallel plate capacitor 415 relative to a bottom electrode 460 of the variable parallel plate capacitor 415. In embodiments, the tether 450 may be made of a low-loss dielectric. While the tether 450 may be made of a low-loss dielectric, because the RF field strength in the tether material is relatively very small any resulting dielectric losses may not be significant. The tether 450 may provide a mechanical link between the top electrode 470 of the variable capacitor 415 and an upper electrode 410 of a separate actuator and thus, may remove the resistive bias connection from the RF circuit. In embodiments, the tether 450 may be made to be stiff so that fine actuation on one end of the tether 450 results in a repeatable actuation on the other end of the tether 450. As shown in FIG. 8, a side electrode 455 may be used as a voltage actuation electrode, while the bottom electrode 460 may be designed to carry, for example, RF signals along with the top electrode 470. A tether 450 may be employed to actuate electrodes of capacitors of various types.

Figure 9A:
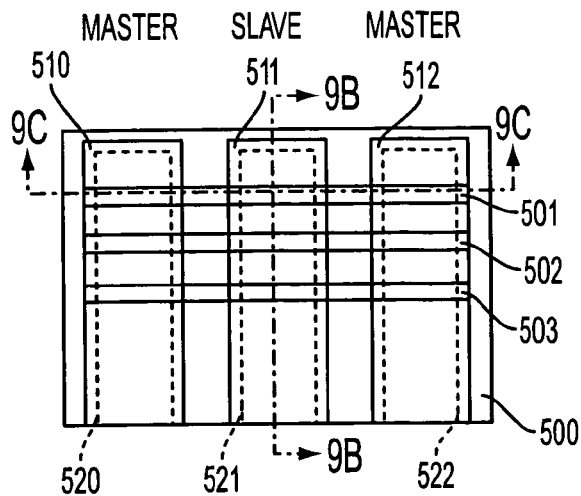
FIG. 9(a) illustrates a top view of an exemplary embodiment of a variable capacitor employing a tether actuated stress-engineered metal cantilever.
Figure 9B:
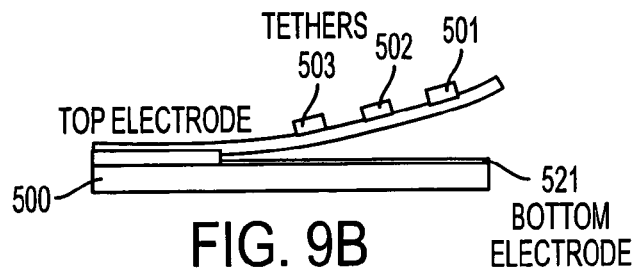
FIG. 9(b) illustrates a cross-section along line b-b' of the capacitor illustrated in FIG. 9(a)
Figure 9C:
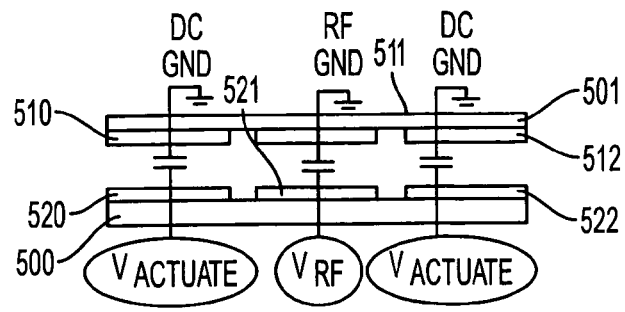
FIG. 9(c) illustrates a cross-section along line c-c' of the capacitor illustrated in FIG. 9(a)

FIGS. 9(*a*)-9(*c*) illustrate the tether concept described above, as applied to a bent-beam variable capacitor. Side cantilevers (masters) may be designed to actuate a central cantilever (slave) that carries the RF signals. In particular, FIG. 9(*a*) illustrates a top view of the exemplary embodiment of the tether actuated bent-beam variable capacitor, FIG. 9(*b*) illustrates a cross-sectional view along line b-b' of the capacitor illustrated in FIG. 9(*a*), and FIG. 9(*c*) illustrates a cross-sectional view along line c-c' of the capacitor illustrated in FIG. 10(*a*).

More particularly, as shown in FIGS. 9(*a*)-9(*c*), two side bottom electrodes 520 and 522 may respectively work with top electrodes 510 and 512 and may provide an actuation voltage via tethers 501, 502, 503 to a middle top electrode 511, while the middle top electrode 511 and a middle bottom electrode 521 may carry the RF signals. As shown in FIG. 9(*b*), the two side bottom electrodes 520, 522 and the middle bottom electrode 521 may be formed on a substrate 500. In embodiments, the RF signal carrying electrodes, e.g., 511, 521, may be thicker to reduce loss while the side electrodes may be designed to enable a lower actuation voltage.

Figure 10A:
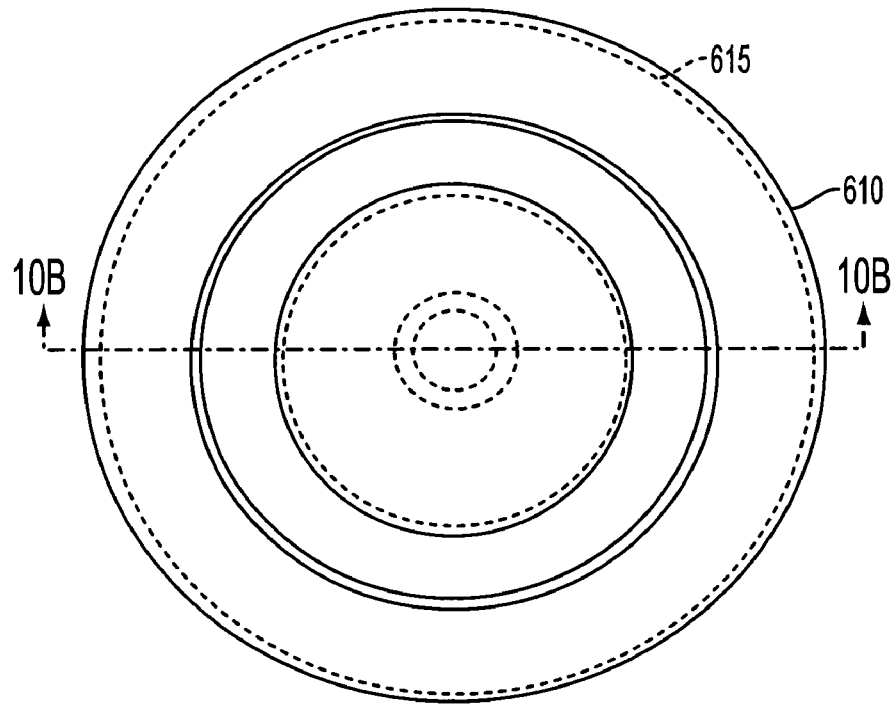
FIGS. 10(a) and 10(b) respectively illustrate a top view and a cross-sectional view of an exemplary embodiment of a membrane based RF capacitor using a low loss dielectric membrane to tether to an outer ring actuated electrode.
Figure 10B:
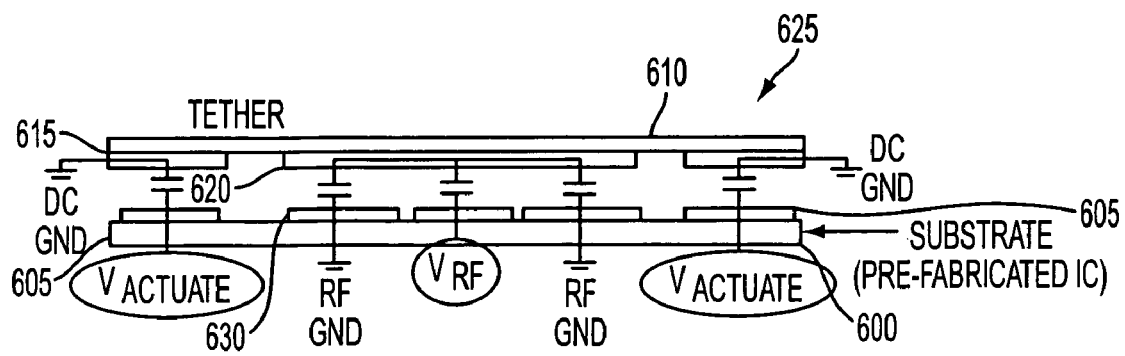

In embodiments, tethered actuation may be implemented in a membrane type variable capacitor. FIGS. 10(*a*) and 10(*b*) respectively illustrate a top view and a cross-sectional view of a membrane based capacitor, e.g., RF capacitor, that may employ a dielectric membrane as a tether 610 to tether a top electrode 620 of the capacitor 625 to an outer ring-shaped actuation electrode 615. To aid in the understanding features of the tether 610, a suspension member for supporting the top electrode is omitted from FIGS. 10(*a*) and 10(*b*). In embodiments, the tether 610 may be made of a low loss dielectric. In embodiments, the tether 610 may connect the top electrode 620 to several actuation electrodes. As shown in the cross sectional view along line b-b' of FIG. 10(*a*) illustrated in FIG. 10(*b*), the tether 610 may simplify the mechanical and electrical designs of actuators 605, 615 formed on a substrate 600, and electrodes, e.g., RF electrodes, 620, 630 because actuation functionality by the actuators 605, 615 and RF functionality by the RF electrodes 620, 630 are substantially decoupled. The tethered actuator approach may also be used as a capacitive RF switch, which is similar to an RF variable capacitor, except that the RF electrode employs bistable as opposed to continuous motion.

Figure 11A:
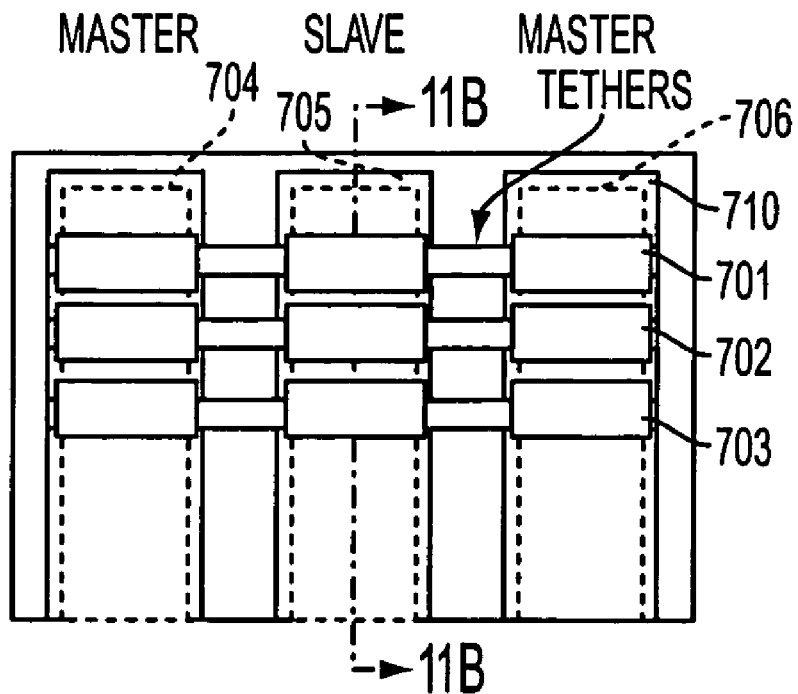
FIGS. 11(a) and 11(b) respectively illustrate a top view and a cross-sectional view of another exemplary embodiment of a variable capacitor employing tethers where the tethers are secured by electroplated staples.
Figure 11B:
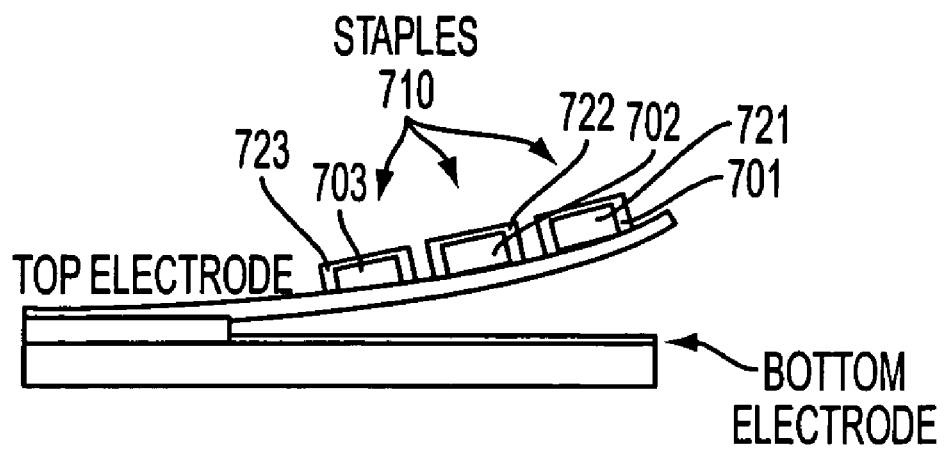
Figure 12A:
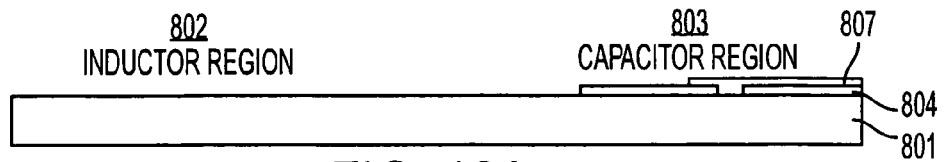
FIGS. 12(a) through 12(e) illustrate an exemplary integration process for forming a planar two-electrode variable capacitor with a microcoil on a prefabricated IC (integrated circuit)
Figure 12B:
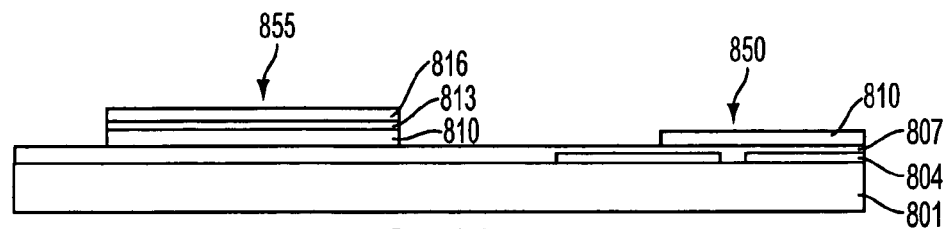
Figure 12C:
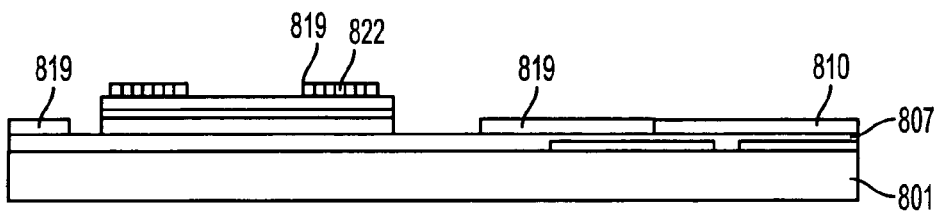
Figure 12D:
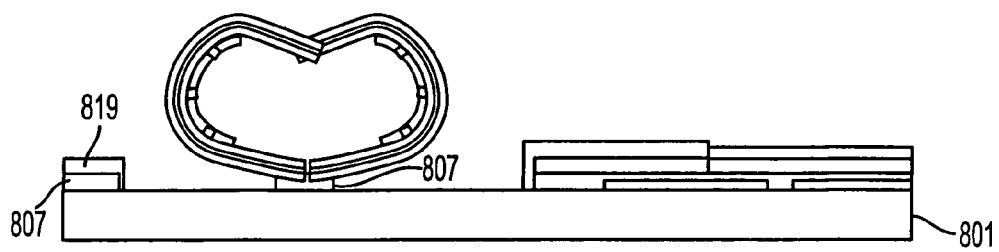
Figure 12E:
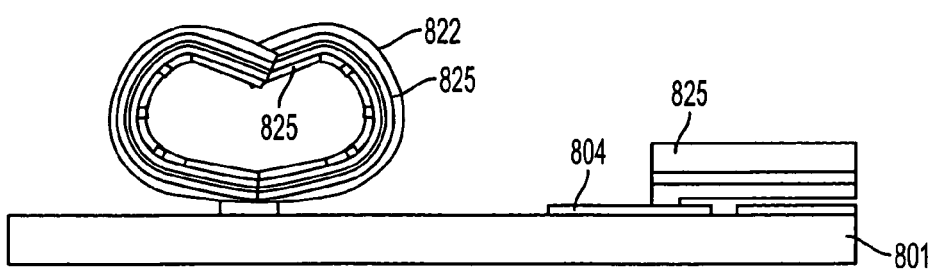

FIGS. 11(*a*) and 11(*b*) illustrate an exemplary embodiment of a variable capacitor employing tethers 701, 702, 703 that are secured to the top electrodes 704, 705, 706 by electroplated staples 710. In some applications, interfaces of the tethers 701, 702, 703 and the respective surfaces of the top electrodes 704, 705, 706 to which the tethers may be attached may be subjected to strong forces. Generally, polymer dielectrics do not adhere very strongly to metals. In some embodiments, electroplated staples 710 may be employed to strap the tethers more securely to the top electrodes 704, 705, 706, as illustrated in FIGS. 11(*a*) and 11(*b*). In particular, depending on a side of an electrode that the tether may be on, the load on the actuating electrode (i.e., master electrode) may be substantially opposite to that applied to a slaved electrode. For example, if tethers are pushing down on the slave electrode, a peeling force will be applied on the master electrodes. Employing electroplated staples 701, 702, 703 may enable more reliable connections between tethers and respective surfaces irrespective of an arrangement or a size of the load.

As illustrated in FIGS. 11(*a*) and 11(*b*), in this exemplary embodiment, the tethers 701, 702 and 703 may be stapled, via staples 710, to respective portions 721, 722, 723 of the top electrode 705. The staples may be formed of electroplated metal that may help anchor the tethers 701, 702, 703 to metal based electrodes. When selecting staples 701, 702, 703, the thickness, weight, etc. of the electroplated metal of the staples 701,702, 703 may be considered as well as the resulting stiffness of the structure including the staples 701, 702, 703.

As discussed above, variable capacitors and inductors that can be integrated together on a same substrate with standard wafer-scale processing are desired. FIGS. 12(*a*)-(*e*) illustrates an exemplary process for integrating a process for forming a planar two electrode variable capacitor with a process for forming stress-engineered metal coils. Both, the stress-engineered metal coil forming process and the variable capacitor forming process employ a release step for releasing either the fingers, e.g., winding patterns, that form the coil windings in a subsequent processing step or a movable plate or electrode of the variable capacitor. Generally, in known stress engineered metal coil forming processes, the stress-engineered metal (e.g., MoCr) fingers of the coil are released before electroplating to create continuous coil windings, because the self-assembly coil forming process forms the coil before thick metal plating is performed. On the other hand, in the variable capacitor forming process, in order to help maintain air gaps for fine actuation control, electroplating may generally be performed before the release of the moveable electrode.

In view of the foregoing, an exemplary process for integrating a variable capacitor and a stress-engineered metal coil employs a two-step process. FIGS. 12(*a*)-12(*e*) illustrate the exemplary process for forming a planar two-electrode variable capacitor together with a stress engineered metal coil. In the exemplary embodiment illustrated in FIGS. 12(*a*)-12(*e*), the variable capacitor has a thin bottom electrode 804. Those of ordinary skill in the art would understand the simple variations that may be employed to modify the exemplary process illustrated in FIGS. 12(*a*)-12(*e*) to form a variable capacitor according to another of the exemplary embodiments described herein (e.g., split bottom electrode or thick bottom electrode or tethered actuators) and/or other applicable structures. Further, for forming a bent beam variable capacitor, it may be acceptable to perform electroplating after release of a top electrode of the capacitor. Thus, for bent beam variable capacitors it may be practical to combine the release steps for both the stress-engineered metal coil and the variable capacitor forming processes.

For ease of explanation, the following description will focus on the steps that occur after an insulating layer, such as, a dielectric layer (e.g., BCB) is patterned and etched on a substrate, such as a prefabricated IC. Further, in FIGS. 12(*a*)-12(*b*), substrate 801 refers to a prefabricated IC on which an insulating layer (e.g., BCB) has been deposited and patterned, e.g., creating vias for connections between applicable layers of the device. Thus, in FIGS. 12(*a*)-12(*b*) the details of the dielectric layer (e.g., BCB) and layers of the prefabricated IC are not illustrated. Persons of ordinary skill in the art would understand the steps and/or materials involved for formation of the substrate 801.

The exemplary integrated process illustrated in FIGS. 12(*a*)-12(*e*) may begin by depositing and patterning a conductive material, e.g., aluminum, for forming the fixed bottom electrode 804 of the capacitor and any contact areas through the BCB to the underlying circuitry. In embodiments, the conductive material may have a thickness of about 0.1 µm to about 5 µm, including exactly 0.1 µm and exactly 5 µm. In embodiments, during this step, a ground plane for the coil may also be formed from the conductive material. Next, a sacrificial layer, e.g., silicon sacrificial layer, 807 may be deposited for gap definition. A metal stack, e.g., 809, 810, 813, 816 may then be sputtered thereon for forming a top electrode 850 of the capacitor in a capacitor region 803 and winding patterns 855 for forming the microcoil windings in subsequent processing steps in an inductor region 802. The metal stack may include various combinations of one or more conductive materials. For example, the metal stack may include titanium (Ti) 809, gold (Au) 810, MoCr 813, and gold 816. In the exemplary embodiment, the MoCr 813 and gold 816 are not deposited in the capacitor region 803. In embodiments, one or more of the materials of the metal stack, e.g., Ti 809, may be used as a sacrificial layer to be removed to release the microcoil windings.

As illustrated in FIG. 12(*b*), in the capacitor region 803, Ti 809 and Au 810 may be deposited while in the inductor region 802, Ti 809, Au 810, MoCr 813 and Au 816 may be deposited. After the metal stack is deposited, the Au 810, the MoCr 813 and the Au 816 in the inductor region 802, and the Au 810 in the capacitor region 803 may be etched to respectively form the patterned layers for the microcoil windings 855 and variable capacitor.

Next, in embodiments, as illustrated in FIG. 12(*c*), a dielectric layer, e.g., BCB, may be deposited and patterned to form tethers 822 for the microcoil. During this step, tethers may also or instead be formed for actuating the variable capacitor. After the tethers 822 are formed, a resist mask 819 may be deposited and patterned. Next, a release step may be performed to release portions of the fingers or windings of the microcoil from the substrate 801. In the exemplary embodiment, the Ti layer 809 of the inductor region 802 under the windings may be etched to release ends of the microcoil windings from the substrate 801. In the center of the microcoil windings, i.e., fingers, the Ti layer 809 may not be etched to preserve anchors for anchoring the microcoil to the substrate 80. During the release step, e.g., etching of a respective portion of the Ti 809 layer, the winding or finger tips lift away from the substrate 801 and the resist mask 819 serves as a load layer that stiffens the windings or fingers of the microcoil. More particularly, the load layer, e.g., the resist mask 819 may be employed to help control an amount of curl of the released portions of the windings or fingers of the microcoil. keep the windings or fingers of the microcoil. For example, the resist mask 819 may keep the windings of fingers of the microcoil from lifting and curling all the way. The load layer, e.g., the resist mask 819, may serve to slow down the release/assembly process and improve assembly yields. In embodiments, material, e.g., polymer, of the load layer may then be reflowed to temporarily reduce the stiffness of the load layer, e.g., resist mask 819. Such reflowing may allow the fingers or windings of the microcoil to lift further. In embodiment, the respective portions of the released fingers or windings portions may kiss, e.g., contact, and mate to form the out-of-plane microcoil structure, as illustrated in FIG. 12(*d*). During the coil assembly, the resist mask 819 may be used to protect hinges of the capacitor suspension structure from etching.

A seed layer (not shown), e.g., Au, may then be deposited for electroplating, e.g., Cu plating, the formed out-of-plane coils of the microcoil and the top electrode of the capacitor. As illustrated in FIG. 12(*e*), Cu 825 may be deposited on exposed surfaces not covered by the resist 819. For example, the Cu 825 may be electroplated on inner and outer surfaces of the coil windings and on an upper surface of the top electrode 850 of the capacitor in the capacitor region 803. Then, as illustrated in FIG. 12(*e*), the capacitor sacrificial layer 807 may be etched. In embodiments, the sacrificial layer 807 may be silicon and the silicon sacrificial layer may be etched using, for example, $XeF_2$ to release the top electrode 850 of the variable capacitor and form a gap between the top electrode 850 and the bottom electrode 804.

The exemplary process described above may be employed to integrally form microcoils and capacitors on a semiconductor substrate. Aside from providing a process of forming high quality integrateable capacitors and microcoils, care must be taken to maintain the high quality characteristics of the devices by carefully designing and forming connections between devices, e.g., between microcoils and capacitors. Otherwise, losses resulting from the interconnections may jeopardize the high quality characteristics of the microcoils and capacitors.

Figure 13A:
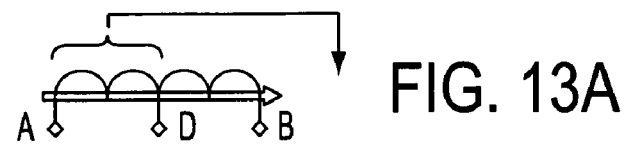
FIG. 13(a) is schematic of an out-of-plane multi-turn coil inductor.
Figure 13B:
FIG. 13(b) is a schematic showing the center tap (node D) moved to the outside of the coil and the end terminals being moved to the inside

It is thus desirable to integrate a microcoil and a capacitor in a configuration with very short distance electrical connections for traces carrying RF signals. One exemplary geometry for shortening connections between the coil and capacitor very well involves placing the capacitor inside the coil. FIG. 13(*a*) illustrates a schematic diagram of a regular inductor and FIG. 13(*b*) illustrates another schematic diagram of an inductor where the center tap is moved out. In particular, the difference between the schematics illustrated in FIGS. 13(*a*) and 13(*b*) is that center tap D has a longer path and a distance between terminals A and B is reduced. As shown and described above with reference to FIG. (7*b*), in a symmetrical circuit, a center tap D generally does not carry an AC signal, so the parasitic tap capacitance may not degrade the frequency of the microcoil. However, the interconnects between the bottom electrodes 305 and terminals of the microcoils A, B are a part of the resonator tank. Thus, in embodiments, the interconnects between the bottom electrodes 305 and the terminals of the microcoils A, B may be made to cause minimal losses. For example, the interconnects between the bottom electrodes 305 may be made as short as possible because generally longer interconnects have larger parasitic capacitance relative to the substrate. The larger parasitic capacitance may decrease a resonance frequency and/or decrease a tuning range of the variable capacitor. In particular, in exemplary embodiments, terminals A, B of the variable capacitor may overlap and connect to terminals A, B of the microcoil.

Figure 14:
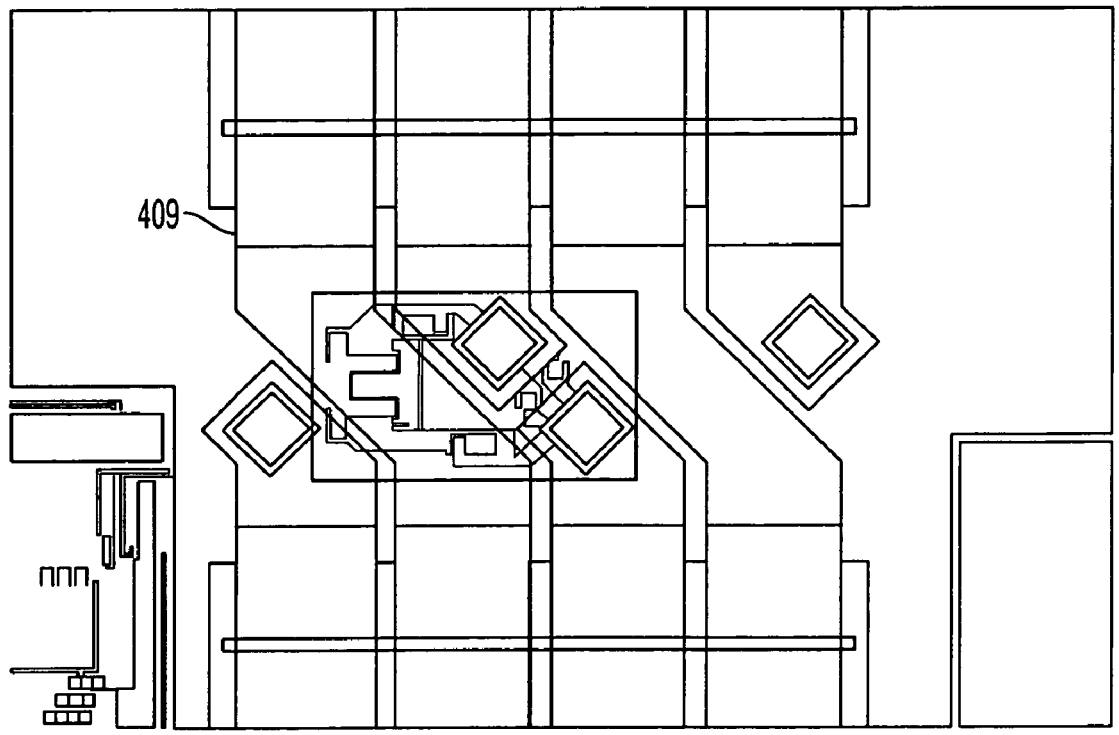
FIG. 14 illustrates a layout diagram of an exemplary embodiment of a center-tapped connected variable capacitor microcoil device including the exemplary parallel plate capacitor shown in FIG. 7(a)

FIG. 14 illustrates a partial layout diagram of an exemplary embodiment of a center-tapped connected capacitor microcoil and capacitors. In the top view of the mask layout shown in FIG. 14, the coil windings are shown as flat layers on the substrate, as the windings may exist before assembly, i.e., unassembled state. As discussed above, during a releasing step, the coil windings may release and mate with respective winding portions to form an out-of-plane microcoil. For clarity and to ease understanding, only a top integrated circuit metal layer 409 is illustrated in FIG. 14. In the exemplary layer diagram illustrated in FIG. 14, terminals of the microcoil and the capacitors are connected using the top metal layer 409. In the exemplary embodiment illustrated in FIG. 14, the capacitors are not tunable.

Figure 15A:
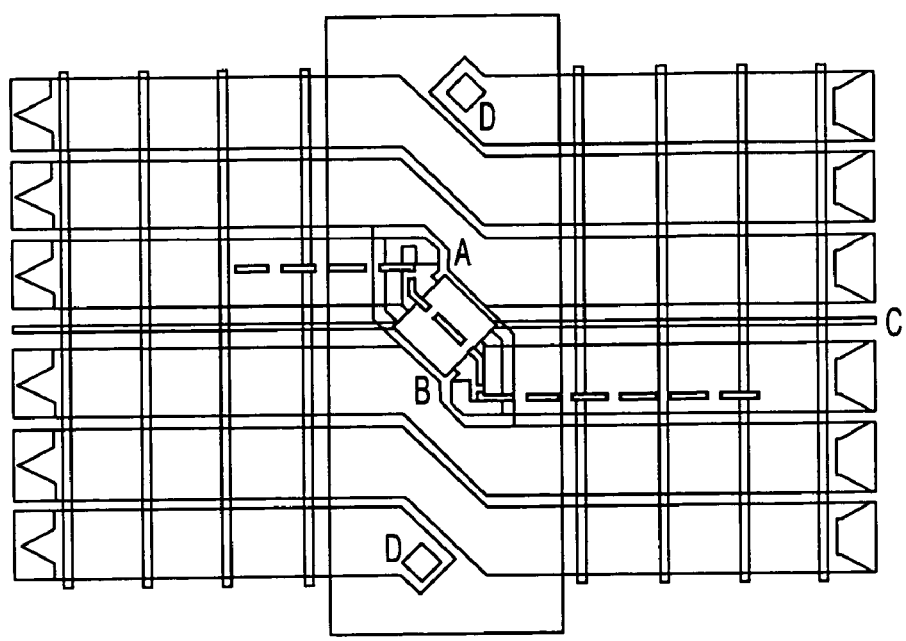
FIG. 15(a) illustrates a top view of a layout diagram of an exemplary embodiment of a concentric variable capacitor microcoil device.
Figure 15B:
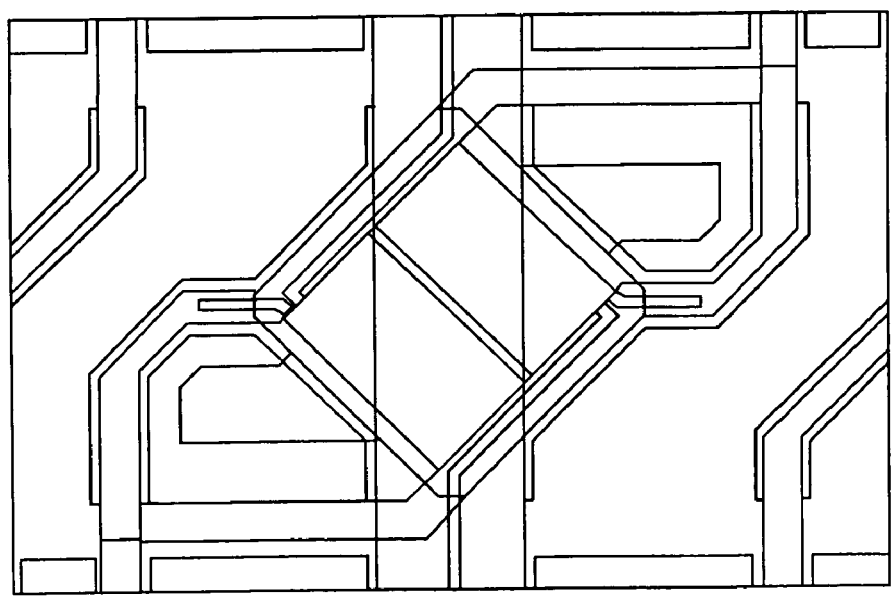
FIG. 15(b) illustrates a closeup view of a central portion of the layout diagram shown in FIG. 15(a)
Figure 16A:
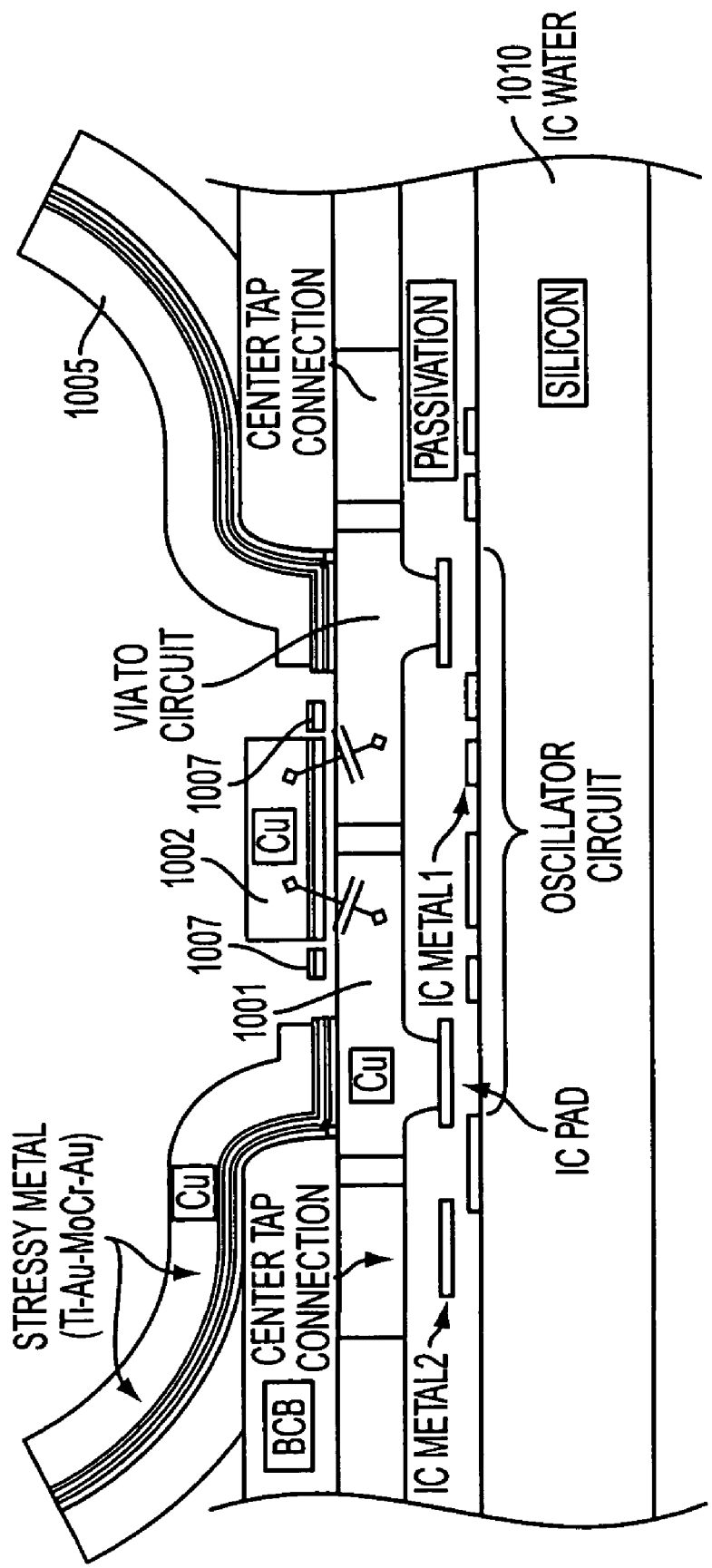
FIG. 16(a) illustrates a cross-sectional diagram of one parallel plate capacitor and a lower portion of two released microcoil windings and one parallel plate capacitor.

FIG. 15(*a*) illustrates a layout diagram of an exemplary embodiment of a concentric variable capacitor microcoil device implementing the coil geometry illustrated in FIG. 13(*b*), i.e., center tap moved out, and the split electrode variable capacitor of FIG. 7(*a*). The electrical nodes A, B, C and D in the voltage plot of FIG. 7(*b*) are correspondingly labeled in FIG. 15(*a*). FIG. 15(*b*) illustrates a closeup view of a central portion of the layout diagram shown in FIG. 15(*a*). The dotted line of FIG. 15(*a*), which runs from one winding, across the split capacitor and through another winding, marks a cross section of the integrated device shown in detail in FIG. 16(*a*).

Figure 16B:
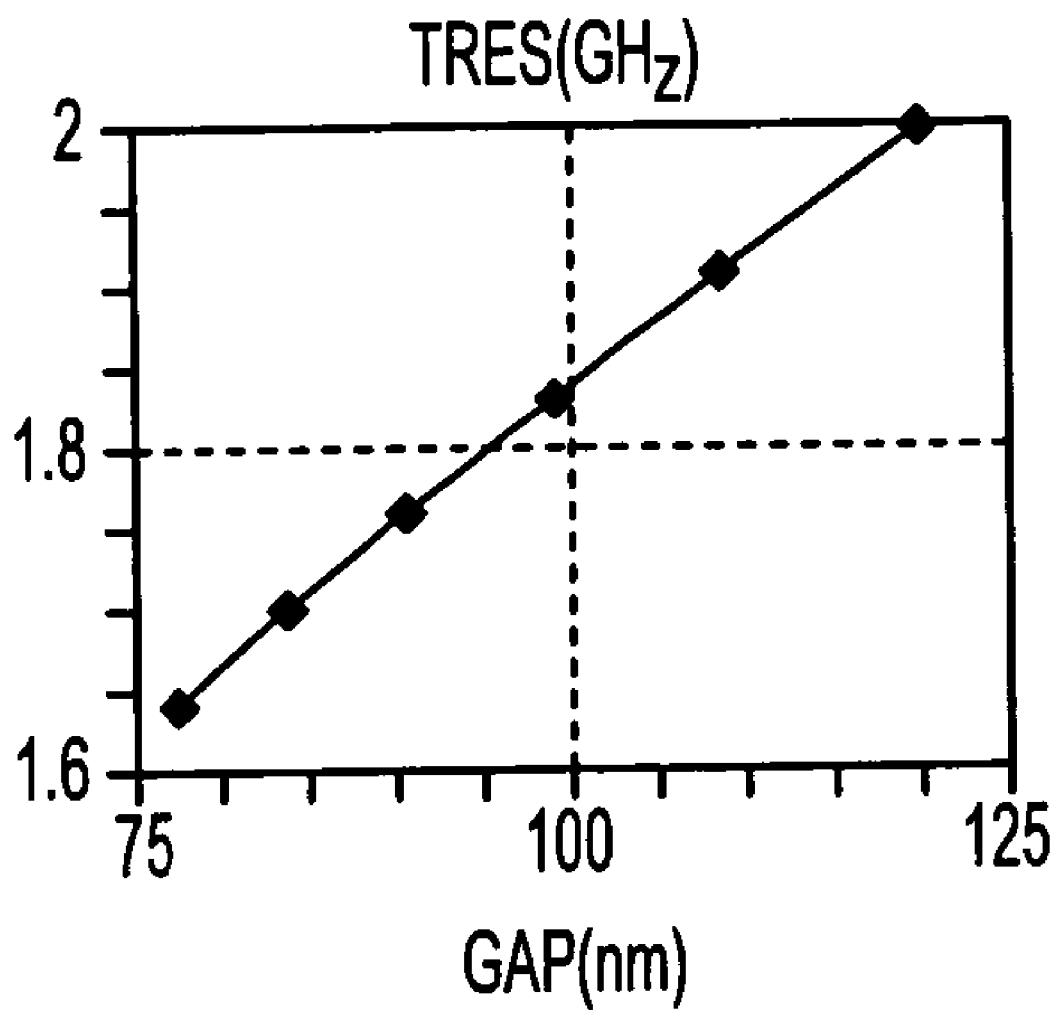
FIG. 16(b) is a graph illustrating an exemplary relationship between gap distance and signal frequencies for tuning the exemplary capacitor of FIG. 15 and FIG. 16(a)
Figure 17A:
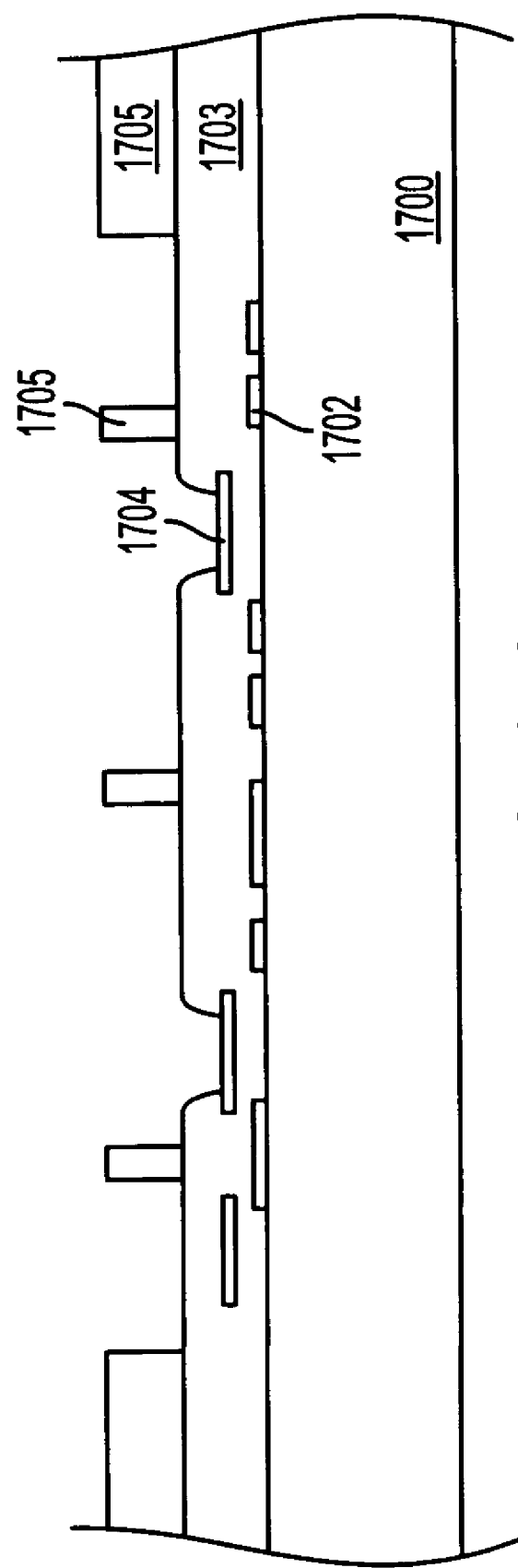
Figure 17C:
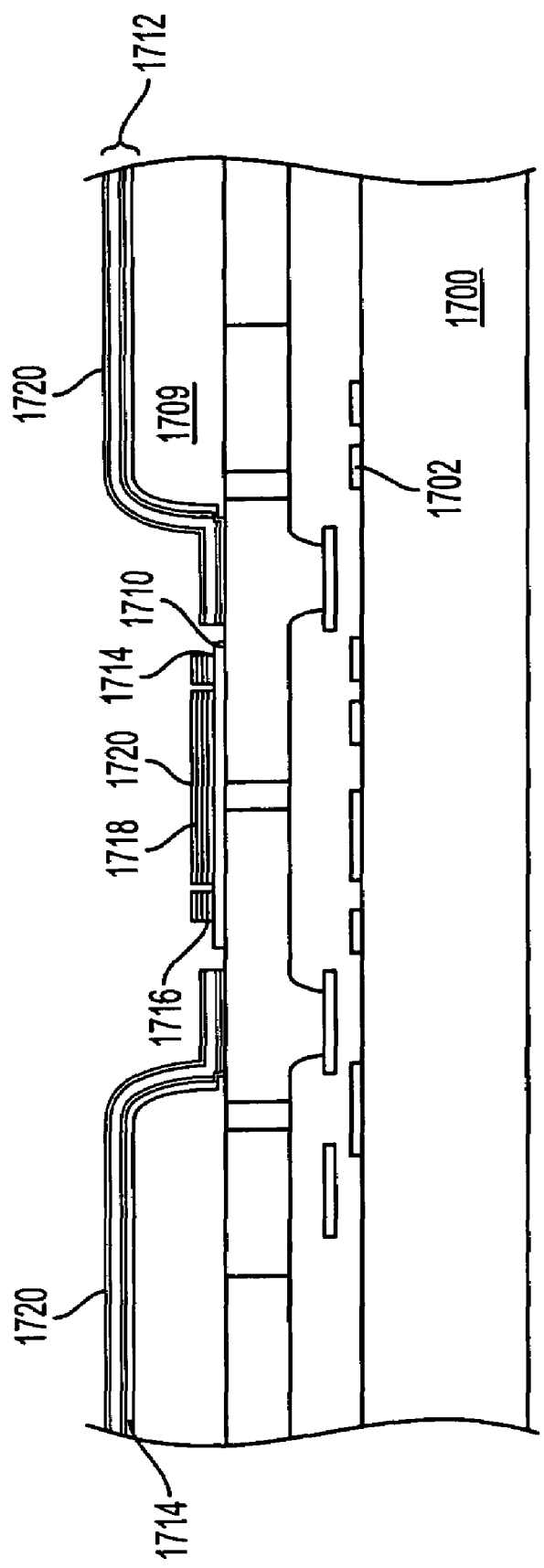
Figure 17D:
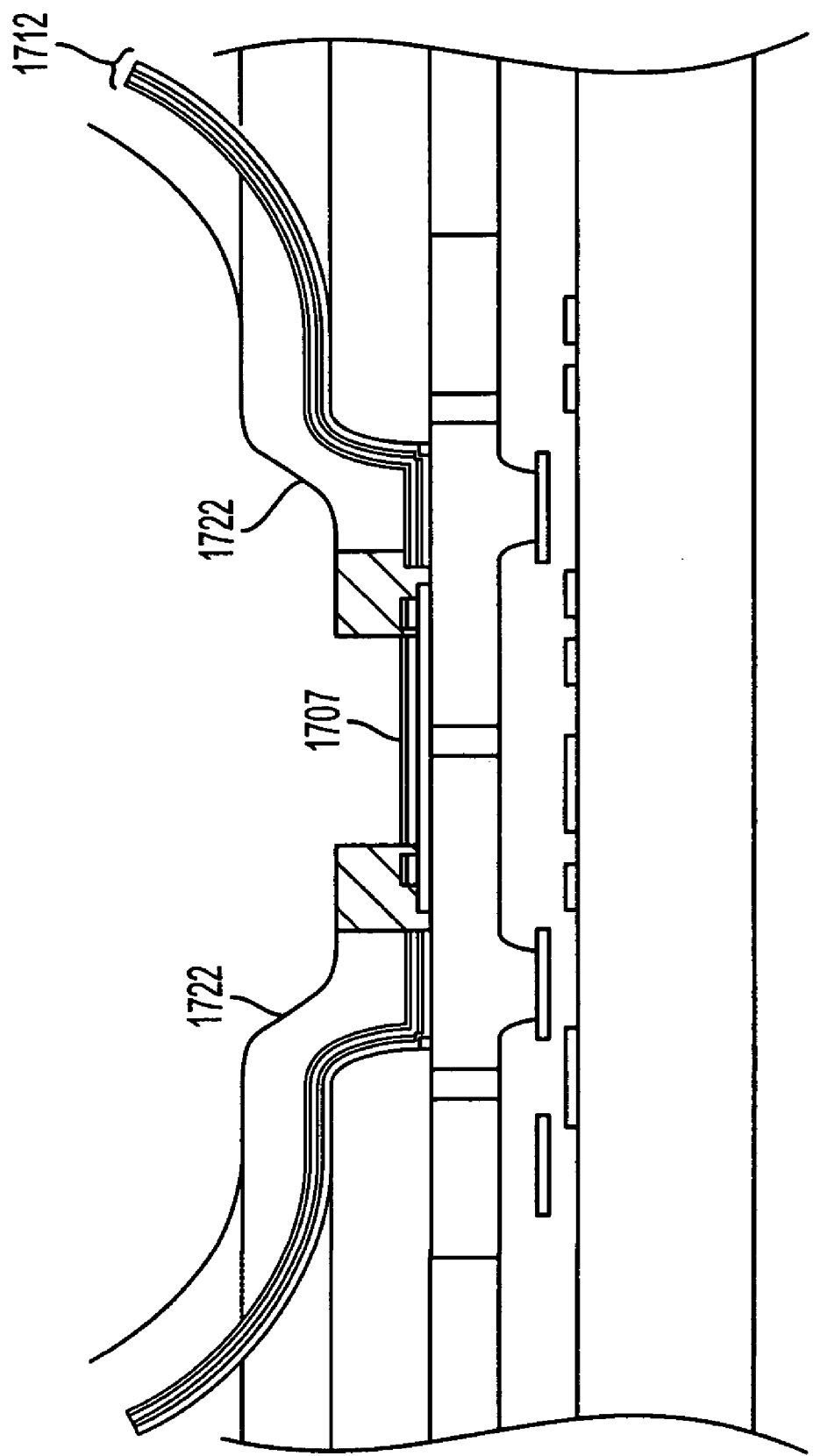
Figure 17E:
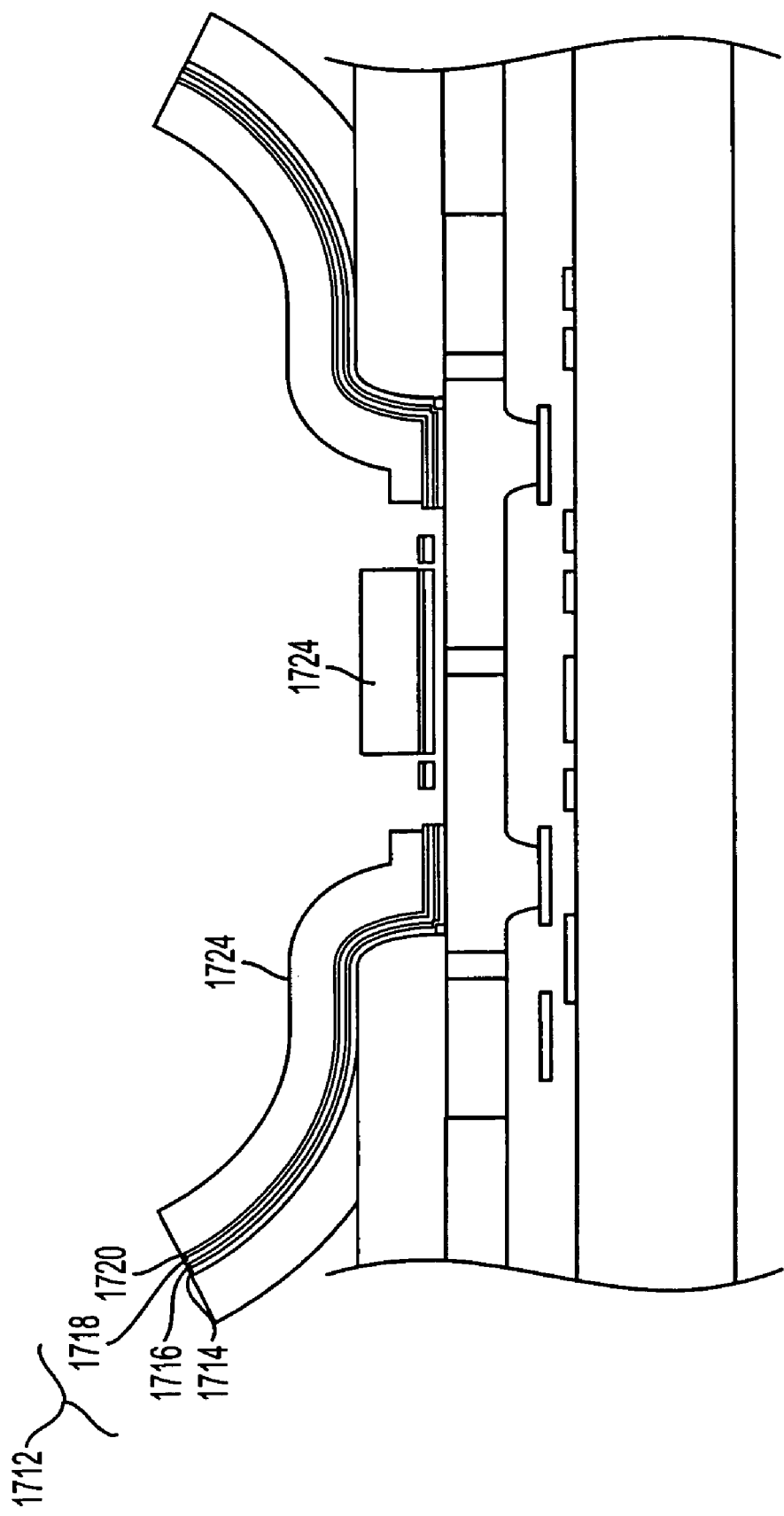

As shown in FIG. 16(*a*), a prefabricated integrated circuit IC wafer 1010 may be employed. In embodiments, bottom electrodes 1001 of a variable capacitor may be implemented as thick metal layers, e.g., Cu, between windings 1005 of a microcoil formed on the prefabricated IC wafer 1010. The variable capacitor may include a top electrode 1002. The top electrode 1002 may be formed of a thick metal, e.g., Cu, electroplated on a conductive supporting member, e.g., titanium-gold member, 1007. As described above, the supporting member 1007 of the capacitor may be formed during a processing step for forming the microcoil windings 1005. The top electrode 1002 of the variable capacitor may be electroplated with, for example, metal during a processing step for electroplating the microcoil windings 1005.

FIG. 16(*b*) illustrates a graph of an exemplary relationship between gap distance and signal frequencies for tuning the exemplary capacitor illustrated in FIG. 16(*a*). As shown in FIG. 16(*b*), generally, as the signal frequency increases, the gap distance increases.

An exemplary embodiment of the concentric microcoil and variable capacitor device may include a 10 nH microcoil including 6 turns, with about 200 μm wide windings at about a 230 μm pitch and about a 270 μm jog length. A 270 μm spring radius may have an equivalent radius of about 340 μm (for inductance calculations). The concentric device may also include two 1.13 pF variable capacitors connected in series. Each of the capacitors may have dimensions of about 180 μm by about 85 μm. Suspension members of the variable capacitors may be about 10 μm wide. With a 2 GHz signal frequency, about a 120 nm gap may exist between the electrodes of each of the two capacitors. An exemplary method for forming the concentric microcoil and variable capacitor structure illustrated in FIG. 16(*a*) will be described in detail below with reference to FIGS. 17(*a*)-17(*e*).

As shown in FIG. 17(*a*), a prefabricated substrate 1700 may include a plurality of patterned metal layers 1702, 1704, and a passivation layer 1703 formed thereon. As shown in FIG. 17(*a*), the process of forming the concentric microcoil and variable capacitor structure may begin by depositing, e.g., growing, and patterning dielectric layer 1705 on the substrate 1700. Next, as shown in FIG. 17(*b*), a seed layer (not shown), e.g., a gold layer, may be deposited, e.g., sputtered on the substrate 1700. Then, an electroplating process may be performed. The electroplating process may involve electroplating a conductive material 1707, e.g., copper. The electroplating material 1707 may fill gaps defined by the patterned dielectric layer 1705. After the electroplating process, a resulting surface of the electroplated material 1707 and the dielectric layer 1705 may be polished and planarized forming a smooth upper surface.

Next, as shown in FIG. 17(*c*), a dielectric layer 1709 such as a low loss dielectric layer, e.g., BCB layer, may be deposited, e.g., spin coated, on the planarized surface of the electroplated material 1707 and the dielectric layer 1705. The deposited dielectric layer 1709 may be patterned to expose a portion of the planarized surface of the electroplated material 1707 and the dielectric layer 1705. A sacrificial layer 1710 may then be deposited on the planarized surface of the electroplated material 1707 and the dielectric layer 1705. The sacrificial layer 1710 may be a silicon sacrificial layer. The sacrificial layer 1710 may be patterned to a shape and size corresponding to a gap between electrodes of the capacitor being formed. In embodiments, a very thin dielectric layer (not shown) may be grown beneath the sacrificial layer 1710. Such a dielectric layer may help reduce and/or avoid an electrical short resulting, for example, from snap down of a top or overlapping electrode of the capacitor.

After patterning the sacrificial layer 1710, as shown in FIG. 17(*d*), a conductive material 1712 may be deposited, e.g., sputtered. The conductive material 1712 may include a plurality of conductive layers forming a conductive stack. At least one of the conductive layers of the conductive material 1712 may be a stress engineered conductive material. For example, the conductive material 1712 may include a Ti layer 1714, a gold layer 1716, a stress-engineered material 1718 and a second gold layer 1720. The stress-engineered material 1718 may be an MoCr layer.

In embodiments, layer(s) of the conductive material may be employed by both the variable capacitor and the microcoil. In embodiments, all the layer(s) of the conductive material may be employed by both the variable capacitor and the microcoil. In embodiments, one of the capacitor and the microcoil may employ only one or some of the layers of the conductive material. In the exemplary process illustrated in FIGS. 17(*a*)-17(*e*) after depositing the conductive material 1712 a portion of the conductive material 1712 corresponding to the top or overlapping electrode of the capacitor may be removed. For example, the second gold layer 1720 and the stress-engineered material 1718 corresponding to the capacitor may be removed (optional). In particular, the capacitor may include the top or overlapping electrode portion and a suspension portion. The top or overlapping electrode may overlap respective portions of the electroplated conductive layer 1707 forming capacitance regions.

After removing a portion of the conductive material 1712, a mask layer or polymer layer 1722, e.g., a photoresist layer or load layer, may be formed. The mask layer 1722 may be formed on the conductive material 1712 and portions, e.g., sides, of the portion of the conductive material corresponding to the top or overlapping electrode of the capacitor. In embodiments where a portion of the conductive material, e.g. layer(s) and/or portion(s) for forming the top or overlapping electrode of the capacitor may be removed, the mask layer 1722 may be formed on a portion of the remaining conductive layer 1712. The mask layer 1722 may be formed on exposed portions of the sacrificial layer 1710 and/or exposed portions of the resulting planarized surface of the electroplated material 1707 and the dielectric layer 1705, as shown in FIG. 17(*d*).

After forming the mask layer 1722, a portion of the conductive material 1712 may be removed, e.g., etched, to form and release a portion of windings of the microcoil from the substrate 1700. FIG. 17(*d*) illustrates lower portions of the windings in a released state. In particular, as discussed above, the conductive material 1712 may include the stress-engineered material, e.g., elastic material, having an intrinsic stress profile that biases a free portion away from the substrate 1700. Thus, when a portion of the conductive material, e.g., an exposed portion of the conductive material 1712, is removed, the intrinsic stress profile causes respective released portions of the conductive material 1712 to move away from the substrate 1700. Various types of patterned structures may be employed to form out-of-plane structures. For example, U.S. Pat. No. 6,534,249 to Fork et al. describes an example of a claw-type structure in which respective released ends of the microcoil windings contact each other.

After this partial release step of the coil windings, a reflow process may be initiated to reflow and soften the mask material 1722 so that the windings may lift higher. As discussed above, the respective portions of the released windings may mate and assemble the coil by allowing tips of the windings or fingers to meet. In embodiments, the tips of the windings or fingers may meet over the capacitor region. The reflow process may serve as a second step of the coil assembly process and may help slow down the assembly so that higher yield assembly can be achieved. The reflow of the mask material 1722 may help cover, for example, newly exposed portions of surfaces that are not to be subjected to electroplating during a subsequent step. Thus, the mask material 1722 may function as a mask to protect underlying areas from a plating bath.

After the release step and the reflow process, exposed portions of the remaining conductive material 1712 may be electroplated with a conductive material 1724, e.g., metal, as shown in FIG. 17(*e*). As shown in FIG. 17(*e*), upper and lower exposed portions of the remaining conductive material 1712 may be electroplated in addition to an upper surface of the top or overlapping electrode. Thus, in embodiments, the mask 1722 may function as a protective layer for protecting portions of the resulting substrate 1700 from electroplating. The electroplating material 1724 may be a copper material.

After the electroplating step, remaining portions of the mask 1722 and any remaining microcoil release material, e.g., Ti 1714, of the conductive material 1712 may be removed, as shown in FIG. 17(*e*). Finally the capacitor is released by removing the capacitor sacrificial layer 1710.

Figure 18:
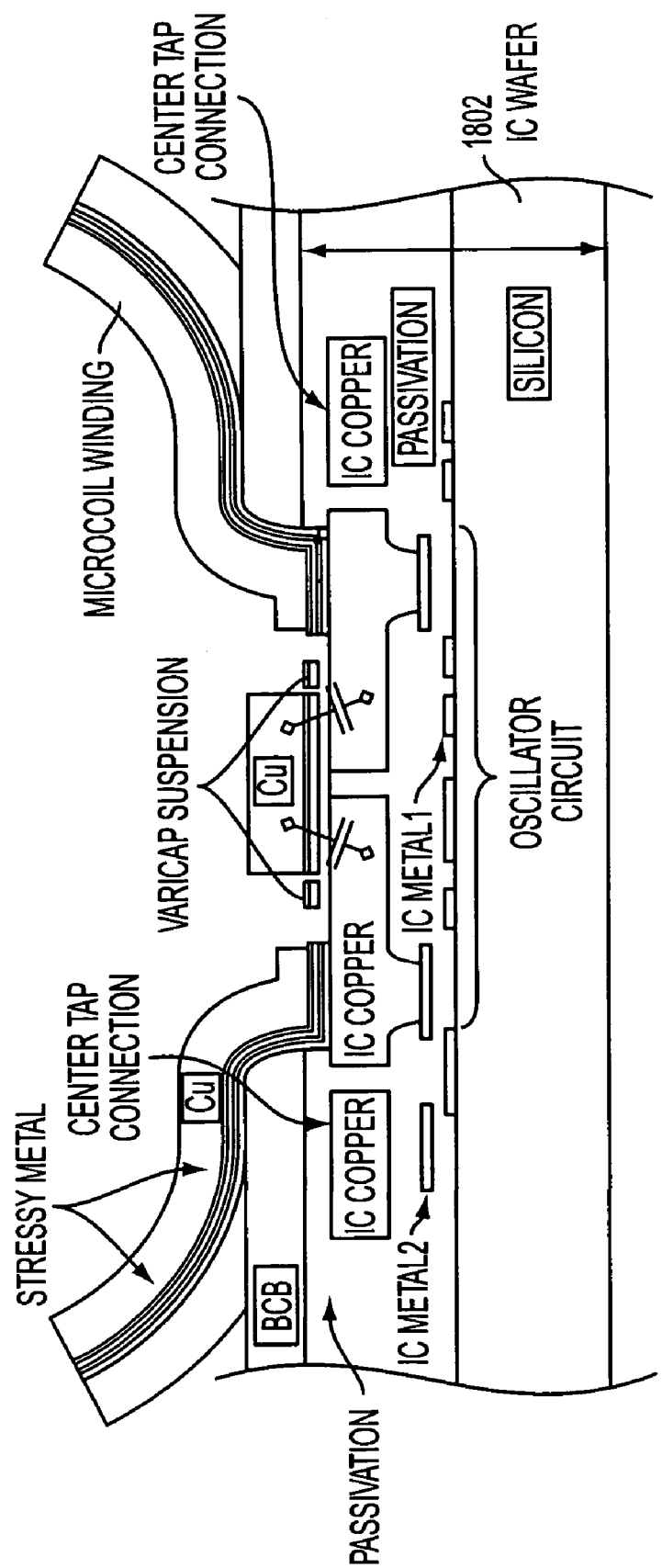
FIG. 18 illustrates a cross-sectional diagram of another exemplary embodiment of a concentric variable capacitor microcoil device.

FIG. 18 illustrates a cross-sectional diagram of another exemplary embodiment of a concentric variable capacitor microcoil device. As shown in FIG. 18, in this embodiment, the prefabricated integrated circuit IC wafer 1802 includes thick metallization, e.g., very thick copper metallization. Such pre-fabricated IC wafers 1802 with very thick metallization may be employed for RF IC processes. In comparison to the process described in relation to FIGS. 17(*a*)-17(*e*) employing the prefabricated IC wafer 1010 shown in FIG. 16(*a*), which did not include a prefabricated thick metallization layer, in embodiments employing prefabricated IC wafers with very thick metallization, e.g., 1802, steps associated with FIGS. 17(*a*) and 17(*b*) may have been completed in advance. In such embodiments, assuming that an upper surface of the prefabricated IC wafer 1802 is polished and planarized, the exemplary process for forming a concentric variable coil device may begin by depositing and patterning a dielectric layer, e.g., BCB layer, as discussed above with regard to FIG. 17(c).

Figure 19:
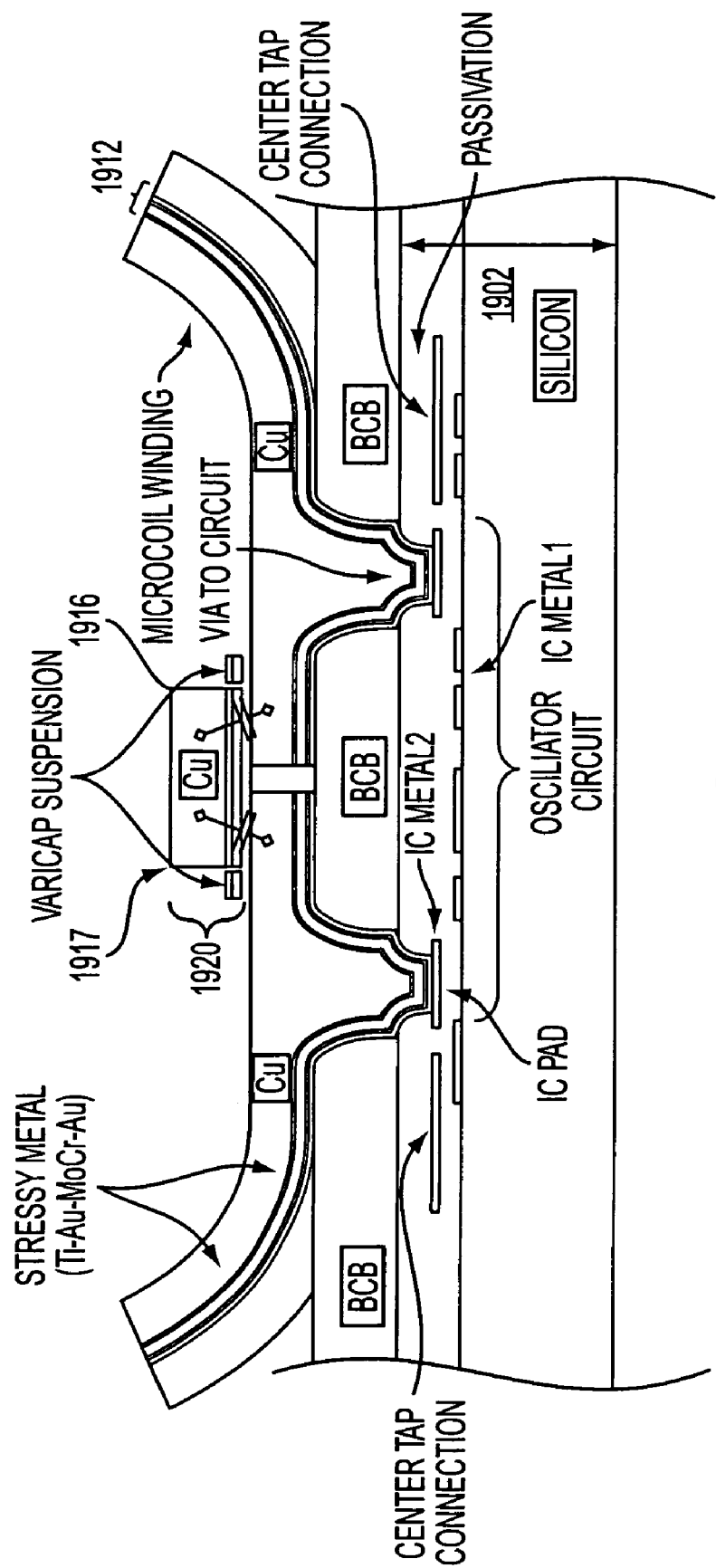
FIG. 19 illustrates a cross-sectional diagram of another exemplary embodiment of a concentric variable capacitor microcoil device.

FIG. 19 illustrates a cross-sectional diagram of another exemplary embodiment of a concentric variable capacitor microcoil device. In the concentric variable capacitor microcoil device shown in FIGS. 16(a) and 18, a plurality of vias, e.g., two vias may be provided to link the coil terminals to the variable capacitor and the underlying circuit. As shown in FIG. 19, in embodiments, terminals of the coil may be extended beneath a top electrode of the variable capacitor. In embodiments, the top electrode may employ a thick electroplated metal layer 1916, e.g., thick copper layer, provided above conductive material 1912 employed by windings of the microcoil rather than below the conductive material employed by windings of the microcoil. More particularly, the thick electroplated metal layer 1916 of top electrode 1917 may be provided above stress-engineered material of the coil windings rather than below the stress-engineered material of the coil windings. As described above, FIG. 17(c) illustrates the conductive material 1712 above the thick electroplated material 1707. By providing the thick metal layer, e.g. electroplated Cu layer, above the conductive material 1912, design of the concentric variable capacitor microcoil device may be simplified. In particular, as shown in FIG. 19, conductive material 1920 associated with the top electrode 1916 may be independent of conductive material 1912 associated with terminals of the microcoil.

An exemplary embodiment of the concentric microcoil and variable capacitor device may include a 10 nH microcoil including 6 turns, with about 200 µm wide windings at about a 230 µm pitch and about a 270 µm jog length. A 270 µm spring radius may have an equivalent radius of about 340 µm (for inductance calculations). The concentric device may also include two 1.13 pF variable capacitors connected in series. Each of the capacitors may have dimensions of about 200 µm by about 95 µm. Suspension members of the variable capacitors may be about 10 µm wide. With a 2 GHz signal frequency, about a 150 nm gap may exist between the electrodes of each of the two capacitors. An exemplary method for forming the concentric microcoil and variable capacitor structure illustrated in FIG. 19 will be described in detail below with reference to FIGS. 21(a)-21(e).

In an exemplary alternative layout pattern of the concentric variable capacitor microcoil device illustrated in FIG. 19, a top plate of the capacitor may additionally extended over the microcoil terminals increasing a size of each of capacitor. For example, assuming the same structure and conditions described above with regard to FIG. 18 but with a top terminal further extended over the microcoil terminals, the capacitor areas may each increase by about 18000 um² and about a 290 nm gap may exist between the electrodes of each of the two capacitors.

Figure 7B:
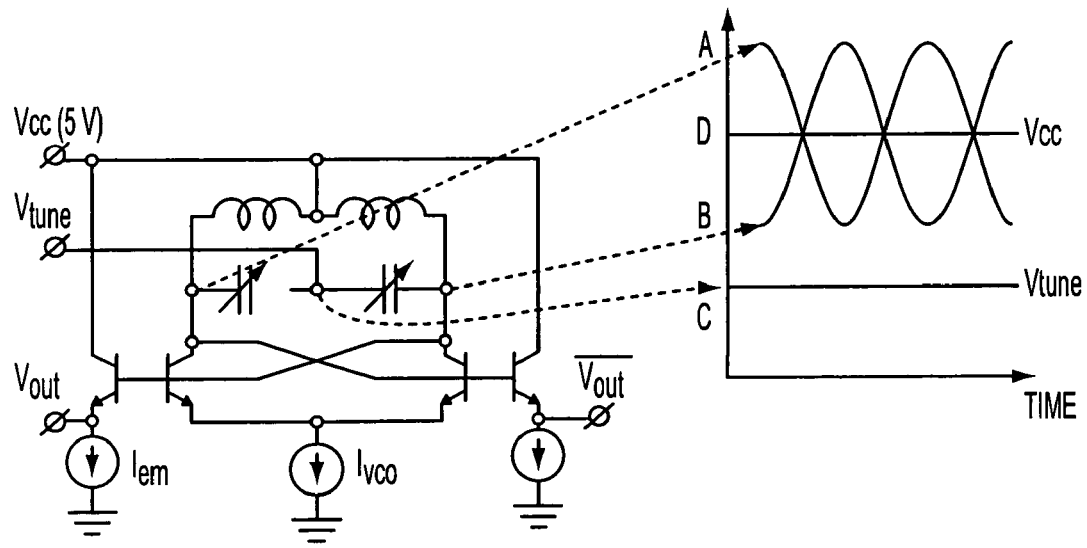
FIG. 7(b) illustrates a schematic of a symmetric or balanced oscillator with a variable capacitor bias that may be implemented using the exemplary capacitor shown in FIG. 7(a)
Figure 20A:
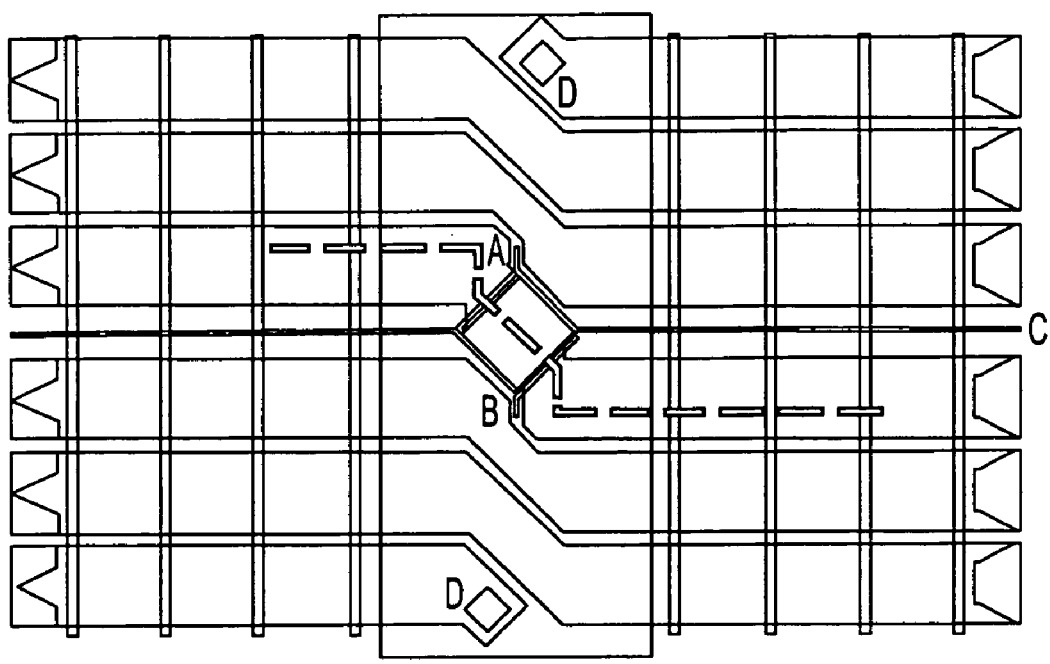
FIG. 20(a) illustrates a layout diagram of the exemplary embodiment of a concentric variable capacitor microcoil device shown in FIG. 19.
Figure 20B:
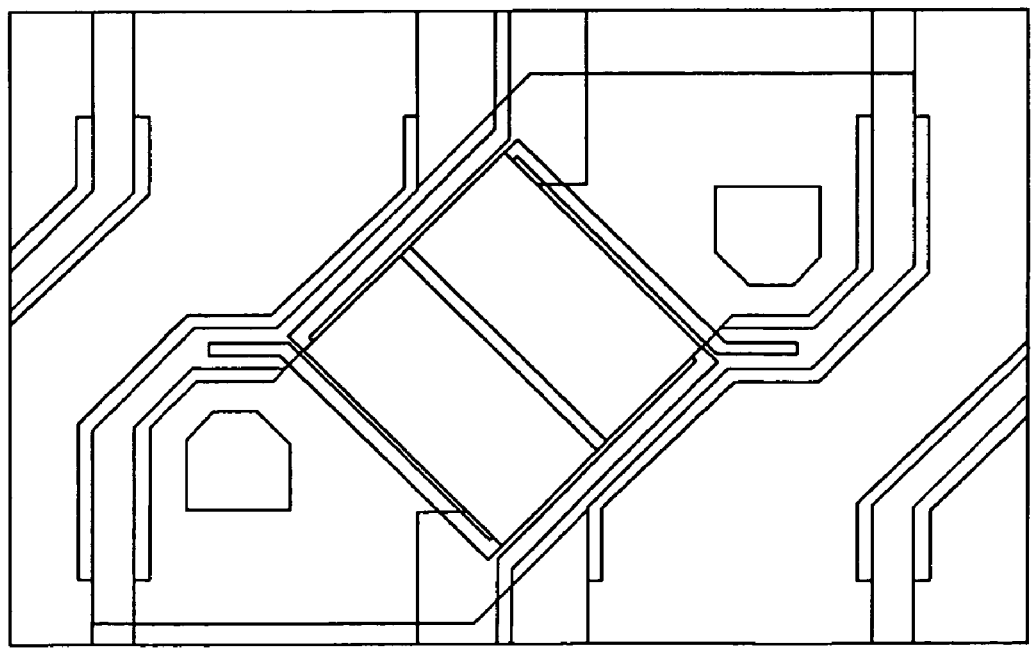
FIG. 20(b) illustrates a closeup view of a central portion of the layout diagram shown in FIG. 20(a)

FIG. 20(a) illustrates a layout diagram of the exemplary embodiment of a concentric variable capacitor microcoil device shown in FIG. 19. The dotted line of FIG. 20(a), which runs from one winding, across the split capacitor and through another winding, marks a cross section of the integrated device shown in detail in FIG. 19. The electrical nodes A, B, C and D in the voltage plot of FIG. 7(b) are correspondingly labeled in FIG. 20(a). FIG. 20(b) illustrates a closeup view of a central portion of the layout diagram illustrated in FIG. 20(a).

Figure 21A:
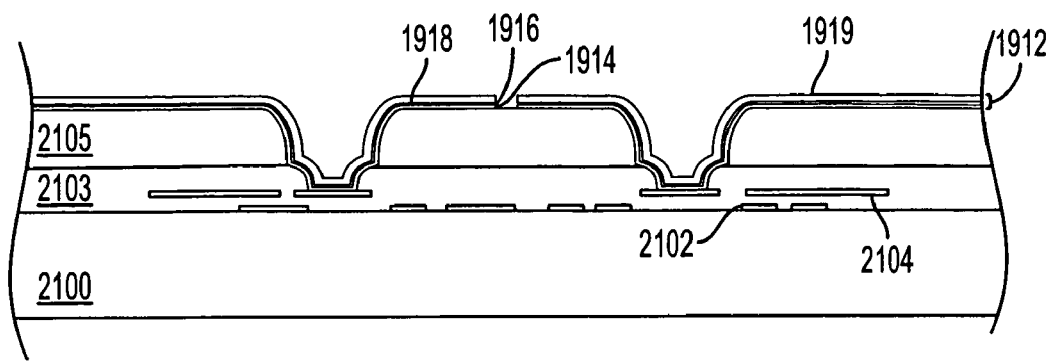
FIGS. 21(a)-21(e) illustrate a process of forming the exemplary concentric variable capacitor microcoil device shown in FIG. 19.

FIGS. 21(a)-21(e) illustrate a process of forming the exemplary concentric variable capacitor microcoil device shown in FIG. 19. As shown in FIG. 21(a), a prefabricated substrate 2100 may include a plurality of patterned metal layers 2102, 2104 and a passivation layer 203 patterned thereon. As shown in FIG. 21(a), the process of forming the concentric microcoil and variable capacitor structure may begin by depositing, e.g., spin coating, a dielectric layer 2105 such as a low loss dielectric layer, e.g., BCB. The deposited dielectric layer 2105 may be patterned to expose portions of the prefabricated metal layer 2104. Next, the conductive material 1912 may be deposited, e.g., sputtered. The conductive material 1912 may include a plurality of conductive layers forming a conductive stack. At least one of the conductive layers of the conductive material 1912 may be a stress engineered conductive material. For example, the conductive material 1912 may include a Ti layer 1914, a gold layer 1916, a stress-engineered conductive material 1918 and a second gold layer 1919. The stress engineered conductive material 1918 may be an MoCr layer. As shown in FIG. 21(a), the conductive material 1912 may overlap the patterned dielectric layer 2105 and the exposed portions of the prefabricated metal layer 2104.

Figure 21B:
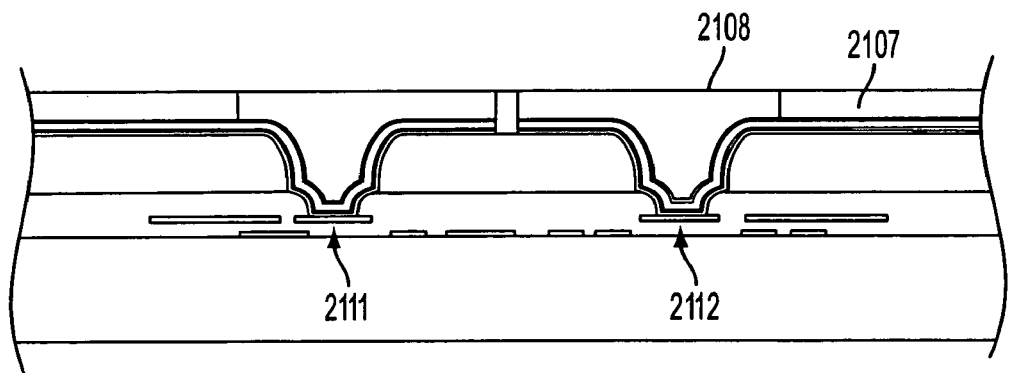

Next, as shown in FIG. 21(b), a dielectric layer 2107 may be deposited, e.g., grown, and patterned on the conductive material 1912. After patterning the dielectric layer 2107, a seed layer (not shown), e.g., a gold layer, may be deposited, e.g., sputtered, on the resulting structure. Next, an electroplating process may be performed. The electroplating process may involve electroplating a conductive material 2108, e.g., copper. The electroplating material 2108 may fill gaps defined by the patterned dielectric layer 2107. After the electroplating process, a resulting surface of the electroplated material 2108 and the dielectric layer 2107 may be polished and planarized forming a smooth upper surface.

Figure 21C:
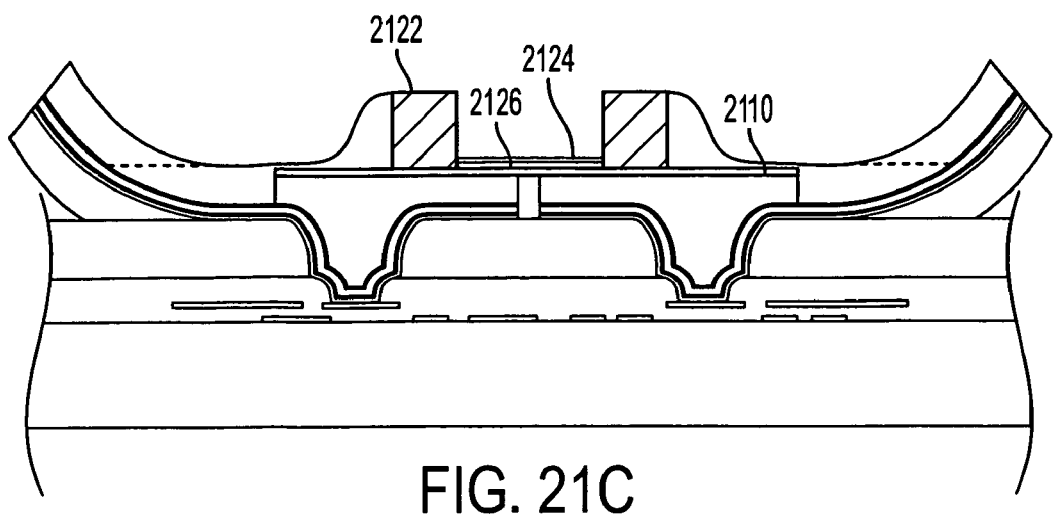
Figure 21D:
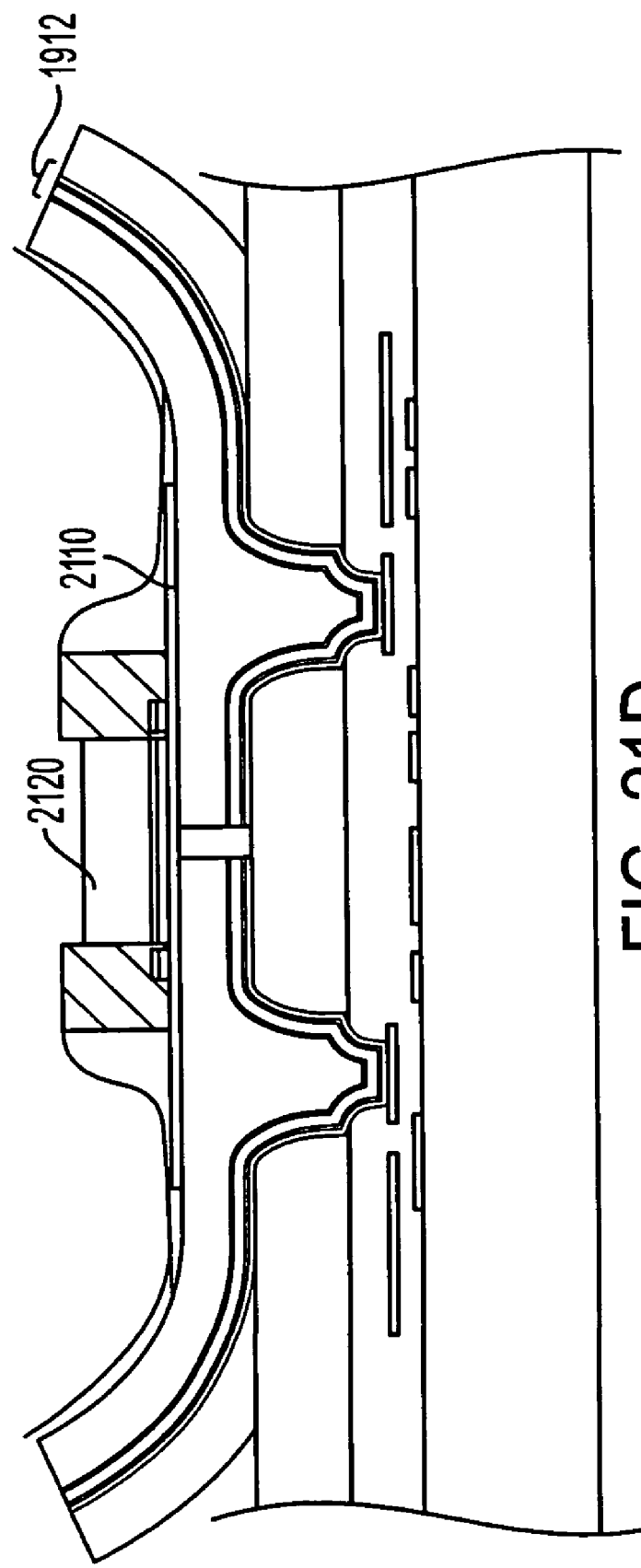
Figure 21E:
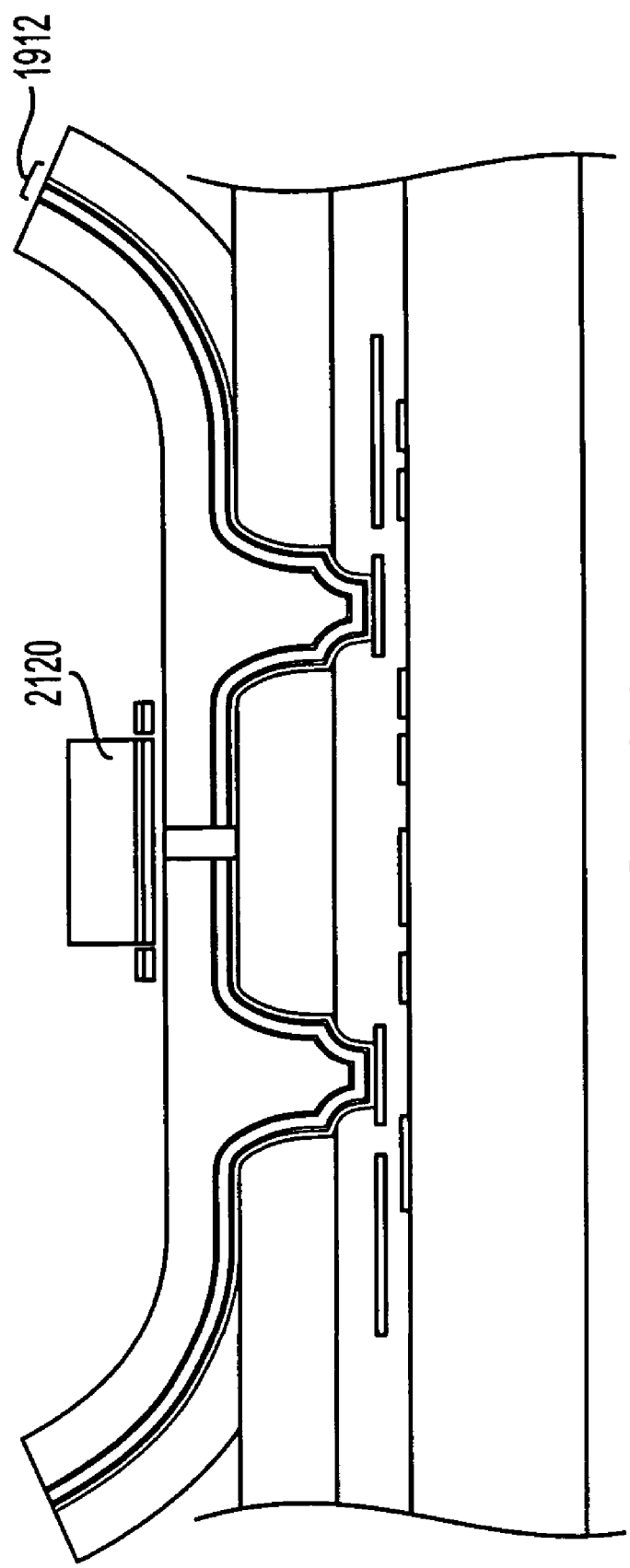

Next, as shown in FIG. 21(c), a sacrificial layer 2110 may be deposited, e.g., grown, on the planarized surface of the electroplated material 2108. The sacrificial layer 2110 may be a silicon sacrificial layer. The sacrificial layer 2110 may be patterned to a shape and size corresponding to a gap between electrodes of the capacitor being formed. In embodiments, as illustrated in FIG. 21(c), the sacrificial layer 2110 may extend over terminals of the 2111, 2112 of the microcoil. In embodiments, a very thin dielectric layer (not shown) may be grown beneath the sacrificial layer 2110. Such a dielectric layer may help reduce and/or avoid an electrical short resulting, for example, from snap down of a top or overlapping electrode of the capacitor.

Next, the sacrificial layer 2110 may be used as an etch mask to remove the dielectric layer 2107. After forming the sacrificial layer, conductive material 1920 for forming the top or overlapping electrode 1917 of the capacitor may be deposited, e.g., grown. As discussed above, the top or overlapping electrode, e.g., 1917, may overlap an electrode portion fixed to the substrate forming a capacitance region. The conductive material 1920 may include a plurality of conductive layers forming a conductive stack. In embodiments, the conductive material 1920 may include a stress engineered conductive material. For example, the conductive material 1920 may include a Ti layer 2124 and a gold layer 2126. Next, still referring to FIG. 21(c), a mask or polymer layer 2122, e.g., a photoresist layer or load layer may be deposited, e.g., spun, and patterned. The mask layer 2122 may be formed on a portion of the conductive material 1920 associated with the overlapping electrode 1917, exposed portions of the sacrificial layer 2110 and exposed portions of the conductive material 1912 associated with the microcoil windings.

After forming the mask layer 2122, a release step may be performed. During the release step, a portion of the conductive material 1912 associated with the microcoil windings may be removed, e.g., etched, to form and release a portion of the windings of the microcoil from the substrate 2100. As discussed above, the conductive material 1912 may include stress-engineered material, e.g., elastic material, having an intrinsic stress profile that biases a free portion away from the substrate 2100. Thus, when a portion of the conductive material, e.g., an exposed portion of the conductive material 1912 is removed, the intrinsic stress profile causes the respective released portions of the conductive material 1912 to move away from the substrate 2100.

After this partial release step of the coil windings, a reflow process may be initiated to reflow and soften the mask material 2122 so that the windings may lift higher. As discussed above, the respective portions of the released windings may mate and assemble the coil by allowing tips of the windings or fingers to meet. In embodiments, the tips of the windings or fingers may meet over the capacitor region. The reflow process may serve as a second step of the coil assembly process and may help slow down the assembly so that higher yield assembly can be achieved. The reflow of the mask material 2122 may help cover, for example, newly exposed portions of surfaces that are not to be subjected to electroplating during a subsequent step. Thus, the mask material 2122 may function as a mask to protect underlying areas from a plating bath.

After the release step and the reflow process, exposed portions of the remaining conductive materials 1912 and 1920 may be electroplated with a conductive material 2120, e.g., metal, as shown in FIG. 21(*e*). As shown in FIG. 21(*e*), upper and lower exposed portions of the remaining conductive material 1912 and an upper portion of the conductive material 1920. The electroplating material 2120 may be a copper material.

After the electroplating step, remaining portions of the mask 2122 and any remaining microcoil release material, e.g., Ti 1914, of the conductive material 1912 may be removed, resulting in the structure shown in FIG. 21(*e*). Finally the capacitor may be released by removing the sacrificial layer 2110 associated with the capacitor.

Applicants filed co-pending U.S. patent application Ser. No. 11/319,075 entitled "Integrateable Capacitors and Microcoils and Methods of Making Thereof" on the same date as this application.

While the exemplary embodiments have been outlined above, many alternatives, modifications and variations will be apparent to those skilled in the art. Accordingly, the exemplary embodiments, as set forth above, are intended to be illustrative and not limiting.

What is claimed is:

1. A method for integrally forming a capacitor and a microcoil on a semiconductor substrate, the method comprising:
   depositing and patterning a dielectric layer on the substrate;
   depositing and patterning a sacrificial layer on the substrate;
   depositing and patterning conductive material on the semiconductor substrate, the patterned conductive material including a windings portion of the microcoil, an overlapping electrode portion of the capacitor and a support portion for the electrode portion of the capacitor;
   depositing and patterning a polymer layer on the semiconductor substrate;
   removing an exposed portion of the conductive material exposed by the patterned polymer layer to release a portion of the conductive pattern from the semiconductor substrate to form out-of-plane windings of the microcoil;
   depositing a second conductive material on exposed portions of the conductive material; and
   removing the sacrificial layer.

2. The method for integrally forming a capacitor and a microcoil on a substrate as claimed in claim 1, wherein depositing and patterning the conductive material comprises forming a first winding portion associated with the microcoil and a second winding portion associated with the microcoil and forming the overlapping electrode portion between the first winding portion and the second winding portion associated with the same microcoil.

3. The method for integrally forming a capacitor and a microcoil on a substrate as claimed in claim 2, wherein:
   forming the overlapping electrode portion between the first winding portion and the second winding portion comprises forming a first capacitance portion and a second capacitance portion, the first capacitance portion corresponding to overlapping portions of the overlapping electrode and a first fixed electrode prefabricated on the substrate, the second capacitance portion corresponds to overlapping portions of the overlapping electrode and a second fixed electrode prefabricated on the substrate, and a distance exists between the first fixed electrode and the second fixed electrode, and
   the first capacitance portion has a first capacitance and the second capacitance portion has a second capacitance, the first capacitance being equal to the second capacitance.

4. The method for integrally forming a capacitor and a microcoil on a substrate as claimed in claim 1, further comprising reflowing the polymer layer after removing the exposed portion of the conductive pattern exposed by the patterned polymer layer.

5. The method for integrally forming a capacitor and a microcoil on a substrate as claimed in claim 1, wherein depositing and patterning conductive material comprises stacking a plurality of metal layers.

6. The method for integrally forming a capacitor and a microcoil on a substrate as claimed in claim 5, wherein the metal layer stack includes a stress engineered material.

7. The method for integrally forming a capacitor and a microcoil on a substrate as claimed in claim 6, wherein the stress engineered material includes at least one of Mo, Cr, Ni, Zr and any combination thereof.

8. The method for integrally forming a capacitor and a microcoil on a substrate as claimed in claim 1, wherein the substrate is a prefabricated integrated circuit including a plurality of patterned metal layers, a passivation layer and an insulating layer formed on the semiconductor substrate, and an outer surface of the prefabricated integrated circuit is planar.

9. A method for integrally forming a capacitor and a microcoil on a substrate, the method comprising:
   forming and patterning a first dielectric layer on the substrate,
   depositing and patterning a first conductive material on the substrate;
   depositing and patterning a second dielectric material on the substrate;
   depositing a second conductive material on the substrate forming at least a first portion and a second portion;
   planarizing an exposed surface of the second conductive material and the patterned second dielectric material;
   depositing and patterning a sacrificial layer on the planarized surface;
   removing the patterned second dielectric material;
   forming third conductive material on the sacrificial layer;
   depositing and patterning a polymer layer on the substrate;
   removing a portion of the first conductive material exposed by the patterned polymer layer to release a portion of the first conductive material from the substrate to form out-of-plane windings of the microcoil;

depositing fourth conductive material on exposed portions of the first conductive material and the third conductive material;

removing the sacrificial layer;

forming each of the first conductive material, the second conductive material and the fourth conductive material to include a first portion and a second portion corresponding to a first winding portion and a second winding portion of the same microcoil; and forming a capacitance region in the third conductive material between the first winding portion and the second winding portion.

10. The method for integrally forming a capacitor and a microcoil on a semiconductor substrate as claimed in claim 9, further comprising reflowing the polymer layer after removing the exposed portion of the conductive pattern exposed by the patterned polymer layer.

11. The method for integrally forming a capacitor and a microcoil on a substrate as claimed in claim 9, wherein at least one of depositing and patterning the first conductive material and forming third conductive material comprises stacking a plurality of metal layers.

12. The method for integrally forming a capacitor and a microcoil on a semiconductor substrate as claimed in claim 11, wherein the metal layer stack includes a stress engineered metal.

13. The method for integrally forming a capacitor and a microcoil on a substrate as claimed in claim 9, further comprising forming a third dielectric layer before forming the sacrificial layer.

14. The method for integrally forming a capacitor and a microcoil on a substrate as claimed in claim 9, further comprising:

providing the capacitance region with a first capacitance region and a second capacitance region separated by a portion of the second dielectric material, wherein the first capacitance region corresponds to overlapping portions of the third conductive layer and the first winding portion, the second capacitance region corresponds to overlapping portions of the third conductive layer and the second winding portion, and the first capacitance region has a first capacitance and the second capacitance region has a second capacitance, the first capacitance being equal to the second capacitance.

15. A method for integrally forming a capacitance region and a microcoil on a substrate, the method comprising:

forming a first electrode and a fixed portion of a second electrode associated with the capacitance region on the substrate;

depositing and patterning a sacrificial layer on the first electrode;

depositing and patterning a conductive material on the substrate, the patterning forming a pattern corresponding to windings of the microcoil and a pattern corresponding to a moveable portion of the second electrode, the moveable portion of the second electrode connecting to the fixed portion of the second electrode;

depositing and patterning a polymer mask layer on the substrate;

removing a portion of the deposited and patterned conductive material exposed by the mask layer to release at least a portion of the windings pattern from the substrate to form out-of-plane windings of the microcoil;

depositing a second conductive material on the formed out-of-plane windings of the microcoil and the moveable portion of the second electrode;

reflowing the polymer layer after removing the exposed portion of the deposited and patterned second conductive material to allow further out-of-plane movement of the windings; and removing the sacrificial layer forming a gap between the first electrode and the second electrode of the capacitor.

16. The method for integrally forming a capacitance region and a microcoil on a substrate as claimed in claim 15, wherein depositing and patterning the conductive material comprises depositing and patterning a stress engineered material.

17. The method for integrally forming a capacitance region and a microcoil on a substrate as claimed in claim 15, wherein depositing and patterning the conductive material comprises depositing and patterning at least one of a Ti layer, a MoCr layer, a Au layer, a Ni layer and any combination thereof.

18. The method for integrally forming a capacitance region and a microcoil on a substrate as claimed in claim 15, wherein depositing and patterning the conductive material comprises depositing and patterning a plurality of metal layers.

19. The method for integrally forming a capacitance region and a microcoil on a substrate as claimed in claim 15, wherein a distance exists between the pattern corresponding to the windings of the microcoil and the pattern corresponding to the capacitance region including the first electrode and the second electrode.

20. The method for integrally forming a capacitance region and a microcoil on a substrate as claimed in claim 15, wherein at least a portion of the capacitance region overlaps with a portion of the formed out-of-plane windings.

* * * * *